(12) United States Patent
Sweezy

(10) Patent No.: US 11,809,518 B1
(45) Date of Patent: Nov. 7, 2023

(54) METHODS, SYSTEMS, AND APPARATUSES FOR CALCULATING GLOBAL FLUENCE FOR NEUTRON AND PHOTON MONTE CARLO TRANSPORT USING EXPECTED VALUE ESTIMATORS

(71) Applicant: Triad National Security, LLC, Los Alamos, NM (US)

(72) Inventor: Jeremy Ed Sweezy, Santa Fe, NM (US)

(73) Assignee: Triad National Security, LLC, Los Alamos, NM (US)

(*) Notice: Subject to any disclaimer, the term of this patent is extended or adjusted under 35 U.S.C. 154(b) by 940 days.

(21) Appl. No.: 15/997,002

(22) Filed: Jun. 4, 2018

Related U.S. Application Data

(60) Provisional application No. 62/515,488, filed on Jun. 5, 2017.

(51) Int. Cl.
*G06F 17/18* (2006.01)
*G06F 30/20* (2020.01)

(52) U.S. Cl.
CPC .................. *G06F 17/18* (2013.01); *G06F 30/20* (2020.01)

(58) Field of Classification Search
CPC ................ G06F 17/18; G06F 30/20
See application file for complete search history.

(56) References Cited

U.S. PATENT DOCUMENTS

2004/0125103 A1* 7/2004 Kaufman et al. ...... G06T 15/40
345/419

2006/0285640 A1* 12/2006 Nizin et al. ........... G06F 30/00
378/65

(Continued)

OTHER PUBLICATIONS

[Bergmann, R., "The Development of WARP - A Framework for Continuous Energy Monte Carlo Neutron Transport in General 3D Geometries on GPUs", PhDT, 2014.*
Asami, Mitsufumi, Hidenori Sawamura, and Kazuya Nishimura. "Monte Carlo shielding calculations for a spent fuel transport cask with automated Monte Carlo variance reduction." J. Nucl. Sci. Technol 2 (2011): 860-865. (Year: 2011).*
Bert, Julien, Hector Perez-Ponce, Ziad El Bitar, Sébastien Jan, Yannick Boursier, Damien Vintache, Alain Bonissent, Christian Morel, David Brasse, and Dimitris Visvikis. "Geant4-based Monte Carlo simulations on GPU for medical applications." Physics in Medicine & Biology 58, no. 16 (2013): 5593. (Year: 2013).*
E.M. Gelbard et al., "A New Class of Monte Carlo Estimators," J. Siam Appl. Math., Vol. 14, No. 4, pp. 697-701 (Jul. 1996).

(Continued)

*Primary Examiner* — Eunhee Kim
(74) *Attorney, Agent, or Firm* — LeonardPatel PC; Michael A. Leonard II; Sheetal S. Patel

(57) ABSTRACT

Global fluence estimators may be calculated on accelerators and processors for neutron and photon Monte Carlo transport. Monte Carlo random walk simulation may be performed on the processors and the calculation of a Volumetric-Ray-Casting (VRC) estimator may be offloaded to the accelerators. The VRC estimator may modify an expected-value estimator to extend a pseudo-particle ray along the direction of the emitted particle from source and collision event through not only the event volume, but also through all volumes that describe the problem geometry. Additionally, many pseudo-particle rays may be sampled per event, rather than just a single pseudo-particle ray per event, in order to provide more complete angular coverage.

20 Claims, 28 Drawing Sheets

(56) References Cited

U.S. PATENT DOCUMENTS

| | | | | |
|---|---|---|---|---|
| 2008/0091388 A1* | 4/2008 | Failla et al. | ......... | A61N 5/1031 |
| | | | | 703/2 |
| 2009/0167763 A1* | 7/2009 | Waechter et al. | ...... | G06T 15/40 |
| | | | | 345/426 |
| 2017/0004267 A1* | 1/2017 | Svatos et al. | .......... | G06N 7/005 |

OTHER PUBLICATIONS

Fang, Q., 2011. Comment on "A study on tetrahedron-based inhomogeneous Monte-Carlo optical simulation". Biomedical optics express, 2(5), pp.1258-1264. (Year: 2011).*

Jensen et al. (Non-Patent Literature, "State of the Art in Monte Carlo Ray Tracing for Realistic Image Synthesis", 2001).*

Lux and L. Koblinger, Monte Carlo particle transport methods: neutron and photon calculations. Boca Raton u.a.: CRC Press, 1991.*

Qianqian Fang and David A. Boas, "Monte Carlo Simulation of Photon Migration in 3D Turbid Media Accelerated by Graphics Processing Units," Opt. Express 17, 20178-20190 (2009). (Year: 2009).*

* cited by examiner

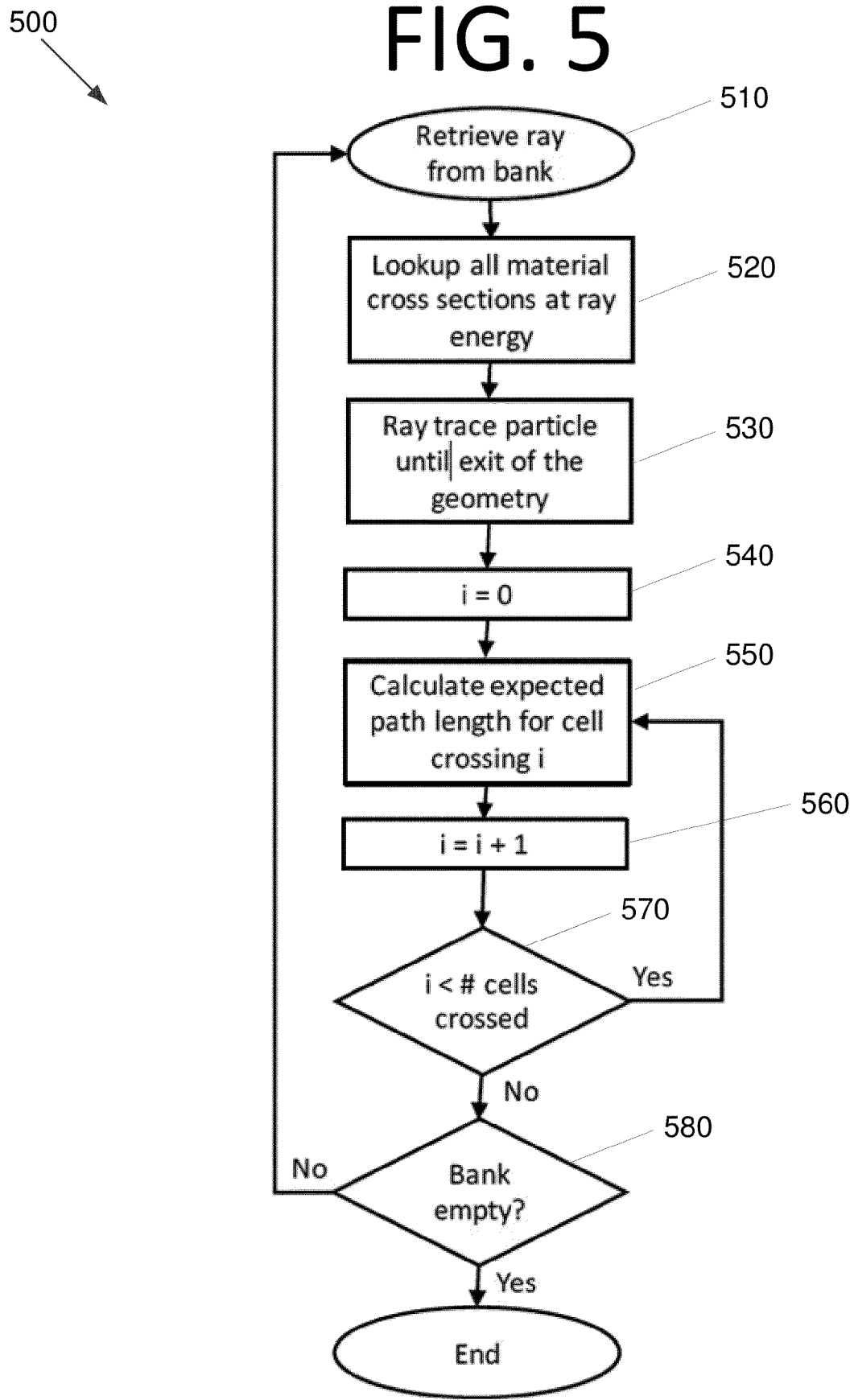

910

1000

1200

1330

1340

1600

METHODS, SYSTEMS, AND APPARATUSES FOR CALCULATING GLOBAL FLUENCE FOR NEUTRON AND PHOTON MONTE CARLO TRANSPORT USING EXPECTED VALUE ESTIMATORS

CROSS-REFERENCE TO RELATED APPLICATION

This application claims the benefit of U.S. Provisional Pat. Application No. 62/515,488 filed Jun. 5, 2017. The subject matter of this earlier filed application is hereby incorporated by reference in its entirety.

STATEMENT OF FEDERAL RIGHTS

The United States government has rights in this invention pursuant to Contract No. DE-AC52-06NA25396 between the United States Department of Energy and Los Alamos National Security, LLC for the operation of Los Alamos National Laboratory.

FIELD

The present invention generally relates to fluence estimators, and more particularly, to methods, systems, and apparatuses for calculating global fluence for neutron and photon Monte Carlo transport.

BACKGROUND

Accelerators augmenting central processing units (CPUs) represents one of the possible paths towards exascale computing. Sixty one of the 500 fastest supercomputers in the world, including the Swiss National Supercomputing Centre's "Piz Daint" machine (the $3^{rd}$ fastest in the world as of May 2018) and Oak Ridge National Laboratory's Titan (the $4^{th}$ fastest in the world as of May 2018), use graphical processing unit (GPU) accelerators (such as those manufactured by Nvidia™). Several research groups have demonstrated specially built Monte Carlo particle transport on GPUs with significant increases in performance.

The standard approach of using accelerators for Monte Carlo particle transport is to port the entire Monte Carlo random walk algorithm to the specialized hardware. However, a general Monte Carlo code, such as Los Alamos National Laboratory's MCNP6® code, represents hundreds of person-years of development (more specifically, MCNP has been in development for over 40 years with over 500 person-years of effort). Porting the entire code base to support specialized hardware is not reasonably feasible.

Global fluence rates are beneficial to calculate local power densities for nuclear reactor core design, dose rates in facilities, neutron activation of reactor components, treatment planning for radiotherapy, and many other applications. Also, the track-length (TL) estimator has been used as the standard estimator for calculating global fluence rates since the mid-1960's. During the random walk, the particle's path length in each cell contributes to the TL estimate of fluence. See TL estimator 100 of FIG. 1. In FIG. 1, a random walk particle enters Cell 1 at point A, has a collision at point B, and exits Cell 1 at point C. TL estimator 100 makes two contributions along the random walk – one at energy $E_{AB}$ with length $\ell_{BD}$ and another at energy $E_{BC}$ with length $\ell_{BC}$. $\Omega$ is the direction in which the particle is emitted.

TL estimator 100 has the advantage that no additional values need to be calculated. The score for a cell is the distance a particle travels in the cell. Each TL estimator score is a random sample of the expected path length of the particle's flight through the cell. The expected path length can be calculated directly:

$$F(i,E) = \frac{W}{\sum_{T,i}(E)} \left[1 - \exp\left(-\sum_{T,i}(E) l_i\right)\right] \quad (1)$$

where i is the tally cell, E is the energy of the particle after collision, W is the statistical weight of the particle, $\sum_{T,i}(E)$ is the total cross-section of cell i at energy E, and $l_i$ is the ray length (i.e., the distance from entrance to possible exit) through cell i. Eq. (1) is the expected-value (EV) estimator. See EV estimator 200 of FIG. 2. More specifically, in FIG. 2, a random walk particle enters Cell 1 at point A, has a collision at point B, and exits Cell 1 at point C. EV estimator 200 makes two contributions to Cell 1 using Eq. (1) – one at energy $E_{AB}$ with length $\ell_{AD} = \ell_{AB} + \ell_{BD}$ and another at energy $E_{BC}$ with length $\ell_{BC}$.

It has been found that the EV estimator generally provided a lower variance than the TL estimator, but since the 1960's, it has been considered too expensive due to the cost of calculating the exponential function. However, new computing hardware provides opportunities to reconsider computational techniques that were once considered too expensive. Accordingly, an improved fluence estimator may be beneficial using modern computing hardware.

SUMMARY

Certain embodiments of the present invention may provide solutions to the problems and needs in the art that have not yet been fully identified, appreciated, or solved by conventional fluence estimators. For example, some embodiments pertain to methods, systems, and apparatuses for calculating global fluence for neutron and photon Monte Carlo transport. In some embodiments, Monte Carlo random walk simulation may be performed on one or more processors and the calculation of a Volumetric-Ray-Casting (VRC) estimator (which may be considered a variant of the EV estimator in some embodiments) may be offloaded to one or more accelerators. In other embodiments, only accelerators, or only processors, may be used, and the Monte Carlo random walk simulations and VRC estimator may each be performed by separate groups of accelerators or processors (or even processor cores). As used herein, "accelerators" refers to graphics accelerators, hardware accelerators, coprocessors, field programmable gate arrays (FPGAs), or any other suitable hardware capable of performing accelerator functionality without deviating from the scope of the invention. "Processors" refers to CPUs, many integrated cores (MIC) processors, or any other suitable processor without deviating from the scope of the invention.

In an embodiment, a computing system includes at least one processor and at least one accelerator. The computing system also includes memory storing computer program code. The computer program code, when executed, is configured to cause the at least one processor to perform Monte Carlo random walk simulation and to cause the at least one accelerator to calculate a VRC estimator. The VRC estimator is configured to extend a pseudo-particle ray along a direction of an emitted particle from each source and collision event through all volumes that describe a problem geometry, or until the pseudo-particle ray is no longer statistically significant within a predetermined threshold. The VRC estimator is also configured to generate a global fluence map for neutron and photon Monte Carlo transport based on the extended pseudo-particle ray.

In another embodiment, a computer-implemented method for implementation of a VRC estimator by at least one accelerator includes retrieving a plurality of pseudo-particle rays from a buffer and looking up all material cross-sections at an energy of the ray, by the at least one accelerator. The computer-implemented method also includes performing ray casting for each ray, by the at least one accelerator. The computer-implemented method further includes calculating, by the at least one accelerator, an expected path length for each cell that is crossed and incrementing a fluence estimate of each cell crossed. Additionally, the computer-implemented method includes generating a global fluence map for neutron and photon Monte Carlo transport based on the incremented fluence estimate, by the at least one accelerator.

In yet another embodiment, a computing system includes at least two processors and memory storing computer program code. The computer program code, when executed, is configured to cause at least one processor of the at least two processors to perform Monte Carlo random walk simulation. The computer program code is also configured to cause at least one other processor of the plurality of processors to calculate a VRC estimator. The VRC estimator is configured to extend a pseudo-particle ray along a direction of an emitted particle from each source and collision event through all volumes that describe a problem geometry or until the ray is not statistically significant based on a predetermined statistical significance. The VRC estimator is also configured to generate a global fluence map for neutron and photon Monte Carlo transport based on the extended pseudo-particle ray.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which:

FIG. 5 is a flowchart illustrating a process for an accelerator implementation of a VRC estimator, according to an embodiment of the present invention.

DETAILED DESCRIPTION OF THE EMBODIMENTS

Some embodiments of the present invention pertain to calculating global fluence estimators on accelerators (e.g., GPUs) and processors (e.g., CPUs) for neutron and photon Monte Carlo transport. More specifically, some embodiments perform Monte Carlo random walk simulation on CPUs and offload the calculation of a new global EV fluence estimator, termed the Volumetric-Ray-Casting (VRC) estimator, to the accelerator. The VRC estimator in some embodiments modifies an EV estimator to extend a pseudo-particle ray along the direction of the emitted particle from source and collision events through not only the event volume, but also through all volumes that describe the problem geometry or until the ray is no longer statistically significant based on a predetermined statistical significance. Additionally, many pseudo-particle rays may be sampled per event, rather than just a single pseudo-particle ray per event, in order to provide more complete angular coverage.

Rays are generated on the CPU and stored in a buffer in some embodiments. When the buffer is full, the buffer may be sent to the accelerator, where the VRC estimator is calculated. The calculation of the VRC estimator on the accelerator is performed concurrently with the Monte Carlo random walk simulation of the CPU in some embodiments. The number of pseudo-particle rays per source or collision event may be chosen such that the CPU and accelerator calculations take approximately equal time.

This approach provides the maximum performance when the CPU and accelerator have equal work. The approach has been shown to perform up to fifteen times more efficiently on an Nvidia™ Titan X GPU than a standard global fluence estimator executed on an 8-core Intel™ Xenon CPU running at 2.60 GHz for some problem types. Novel features of some embodiments include, but are not limited to: (1) performing the ray-casting on the accelerator concurrently with the Monte Carlo random walk on the CPU; (2) sampling many rays at the source or collision event; and (3) using a modification of the EV estimator for global fluence calculations, called the Volumetric Ray Casting (VRC) estimator herein.

Figure 1:
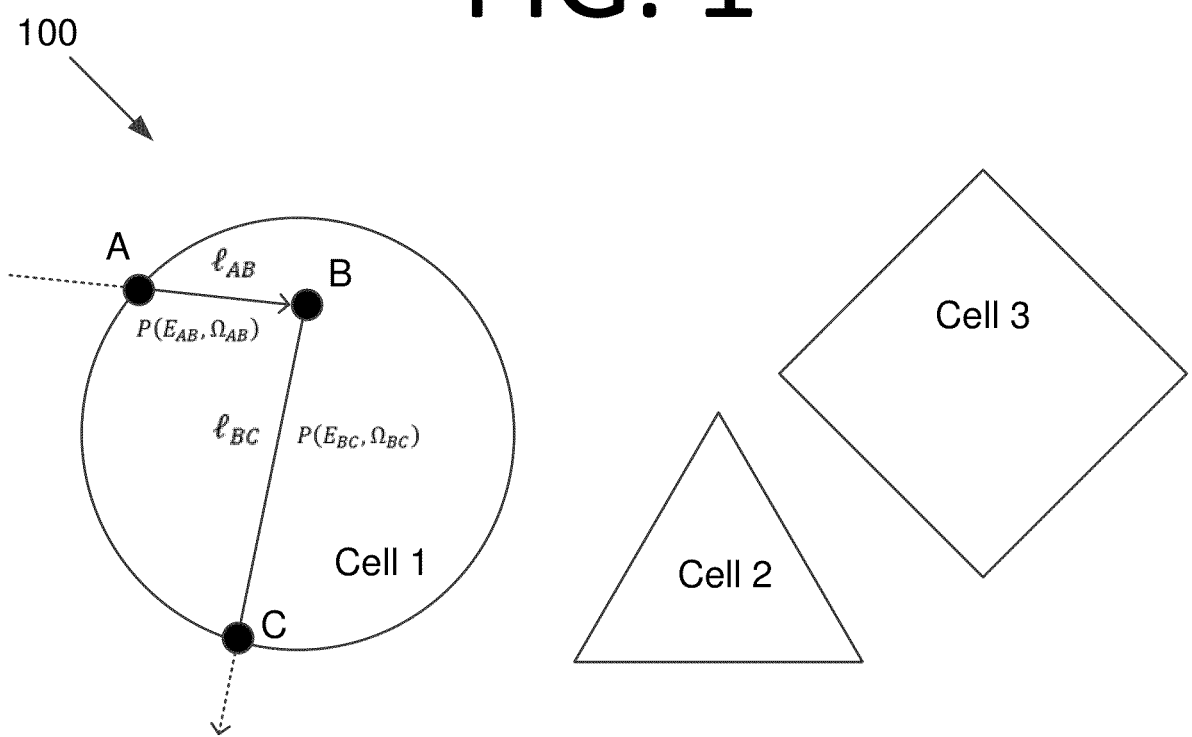
FIG. 1 illustrates a track-length (TL) estimator.
Figure 2:
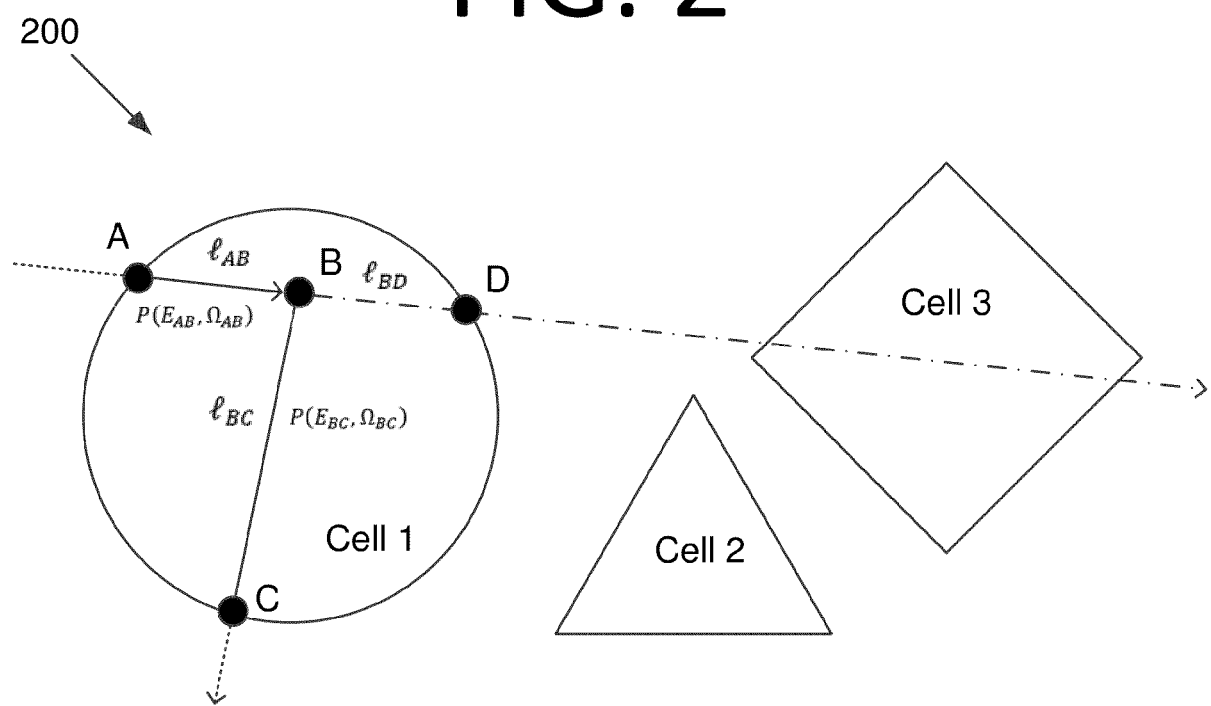
FIG. 2 illustrates an EV estimator.

The EV estimator can be extended to contribute to cells in which the random walk does not pass through. Looking at FIG. 2, for instance, the ray along A-B-D also intersects Cell 3, as shown by the dashed line. However, conventional EV estimator 200 does not use this information. The contribution to Cell 3 can also be calculated from Eq. (1), but the statistical weight W should be modified to account for attenuation of the ray prior to entering the cell. The statistical weight entering cell i, $W_i(E)$, is calculated from the optical thickness between the collision or source point and the point the ray enters the cell:

$$W_i(E) = W \exp\left[-\int_0^{|r'-r|} \Sigma_{T,i}(r + \Omega s, E) ds\right] \quad (2)$$

where $W_i(E)$ is the statistical weight of the particle entering cell i, i is the tally cell, E is the energy of the particle emitted in direction $\Omega$, W is the statistical weight of the particle at collision, r is the collision point, and r' is the point that the ray enters cell i. The integral expression is the optical thickness. Combining Eqs. (1) and (2) results in:

$$F(i,E) = \frac{W\left[1 - \exp\left(-\Sigma_{T,i}(E) l_i\right)\right]}{\Sigma_{T,i}(E)} \times \exp\left[-\int_0^{|r'-r|} \Sigma_{T,i}(r + \Omega s, E) ds\right] \quad (3)$$

It should be noted that $\ell$ and l are used interchangeably herein (namely, they denote ray length).

A unique property of the EV estimator expressed in Eq. (3) is that it scores to cells other than the cells along the path of the random walk. The use of this type of EV estimator as an expected leakage estimator has been previously considered. More recently, it has been used to improve estimates of fluence and reaction rates in cells that see few random walk particles. A modification of this estimator in some embodiments provides an alternative to the TL estimator for estimating global fluence rates. This type of ray casting through volumes is a technique for physically based rendering for optical images. In the context of rendering, passing a ray through a volume is also known as volumetric ray casting, volume ray casting, volumetric ray tracing, and volume ray marching.

Figure 3:
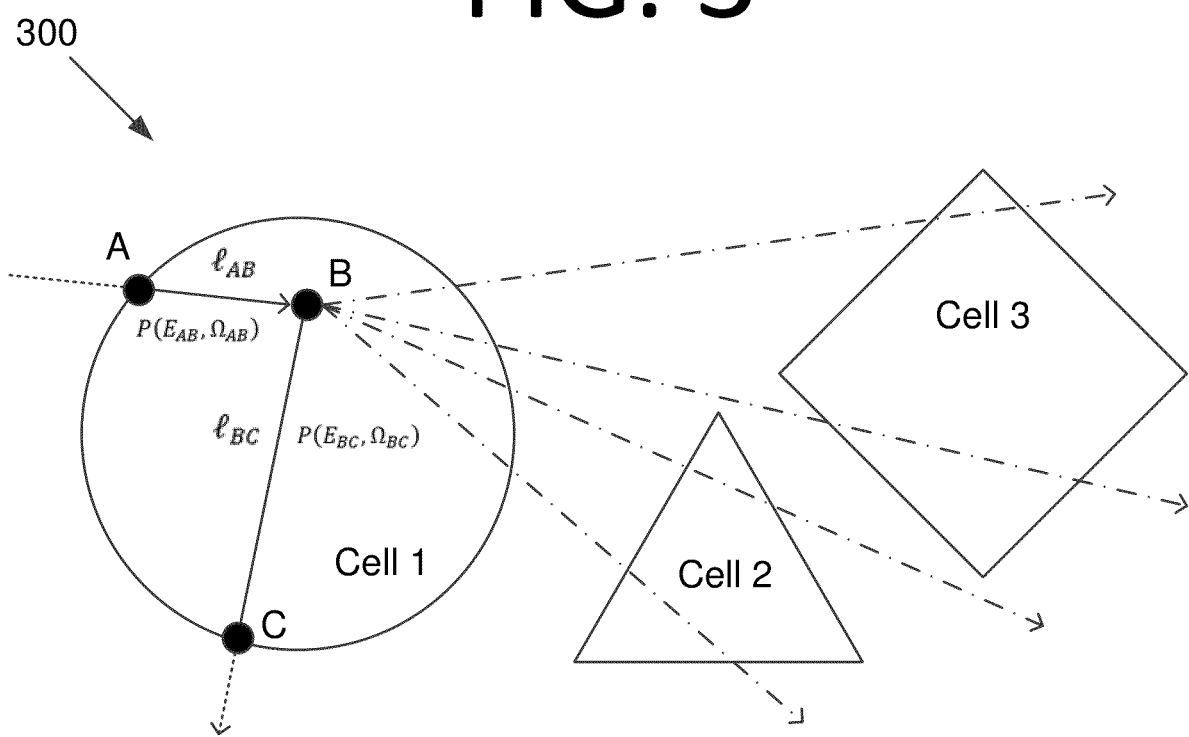
FIG. 3 illustrates a volumetric-ray-casting (VRC) estimator, according to an embodiment of the present invention.

With the advent of hardware accelerators (including, but not limited to, GPUs), it is possible to consider not only a single ray per collision, but instead to sample many possible rays. See VRC estimator of FIG. 3. If multiple rays per source or collision event are sampled, the statistical weight of each ray should then be reduced appropriately, resulting in the following modification of Eq. (3):

$$F(i,E) = \frac{W\left[1 - \exp\left(-\Sigma_{T,i}(E) l_i\right)\right]}{N \Sigma_{T,i}(E)} \times \exp\left[-\int_0^{|r'-r|} \Sigma_{T,i}(r + \Omega s, E) ds\right] \quad (4)$$

where N is the number of outgoing rays sampled per collision. The VRC estimator described by Eq. (4) is referred to herein as the volumetric-ray-casting (VRC) estimator to differentiate it from the EV estimator. However, it should be noted that the VRC estimator is conceptually the EV estimator used in the extreme.

The power of the VRC estimator comes from the fact that more information is obtained from each particle collision than from the TL estimator. When using a traditional CPU, this power is negated by the additional computational expense of performing the ray casting. The proposed approach of some embodiments offloads the ray casting to the hardware accelerator and hides any additional expense by performing the ray casting concurrent with the random walk on the CPU.

Implementation of a VRC Estimator

A library called MonteRay has been written using CUDA C/C++ (CUDA) to evaluate an implementation of a VRC estimator on GPU hardware. MonteRay uses continuous energy total cross section data and can transport particles in 3-D Cartesian mesh geometry. MonteRay has been coupled with LANL's newest Monte Carlo particle transport code, the Monte Carlo Application Toolkit (MCATK). MCATK, a modular C++ code, has been in development since 2008. It is capable of transporting neutrons and photons using continuous energy ACE formatted cross section data.

The random walk was performed with MCATK on the CPU and rays from collisions were sampled on the CPU. When sampling multiple rays per collision, the collision isotope and collision reaction channel were not resampled. Instead, the outgoing particle direction and particle energy from the chosen collision reaction channel was sampled multiple times. The rays were stored in a buffer and transferred to the GPU when the buffer became full. For assessing the performance of multiple CPU cores paired with a single GPU, MCATK was executed with the message passing interface (MPI), and a single collision buffer was shared among the MPI processes of a node using MPI-3 shared memory. Only a single call to MonteRay, besides data transfer, was inserted into the Monte Carlo particle history loop in this embodiment.

Figure 4A:
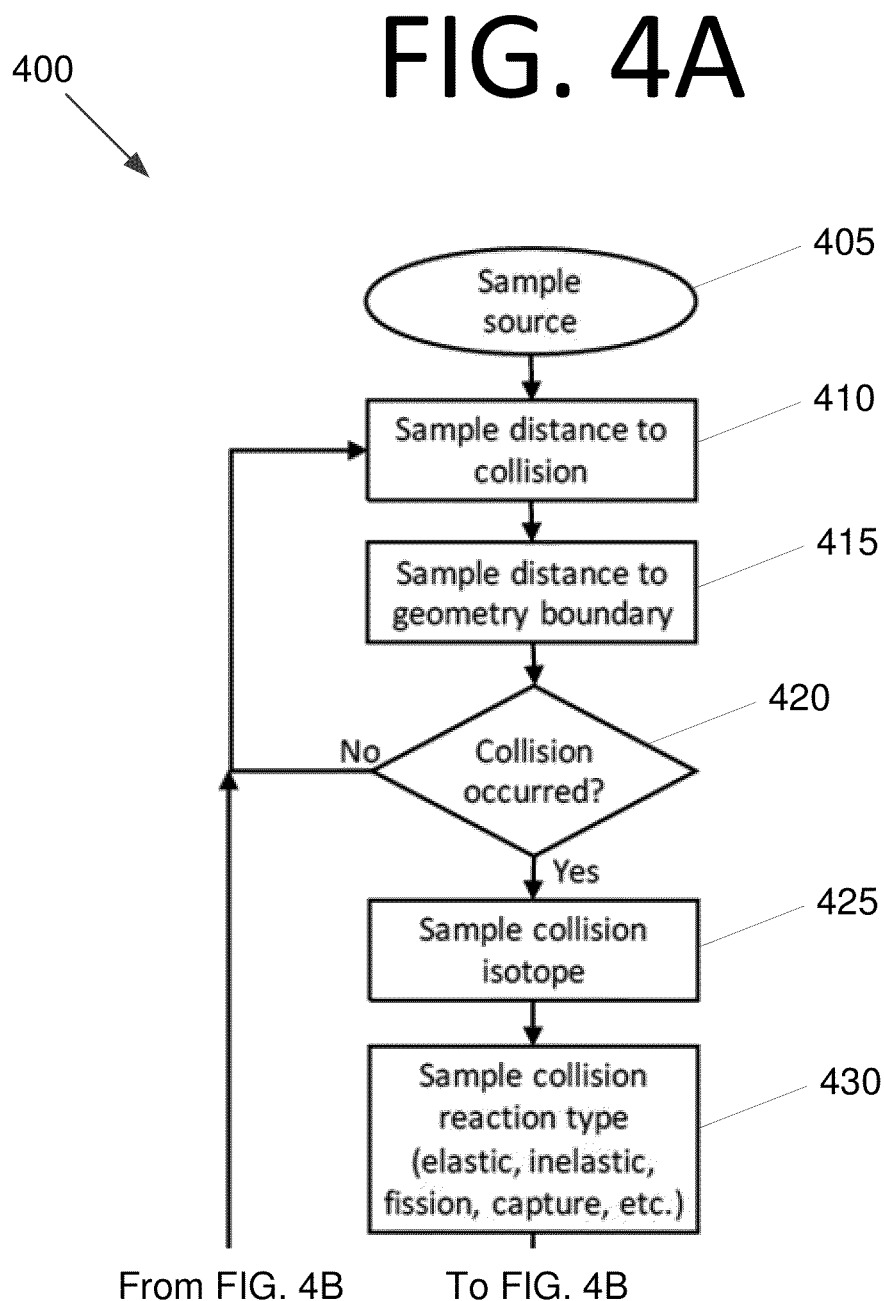
FIGS. 4A and 4B are a flowchart illustrating changes to the Monte Carlo particle history flow for the calculation of the VRC estimator, according to an embodiment of the present invention.
Figure 4B:
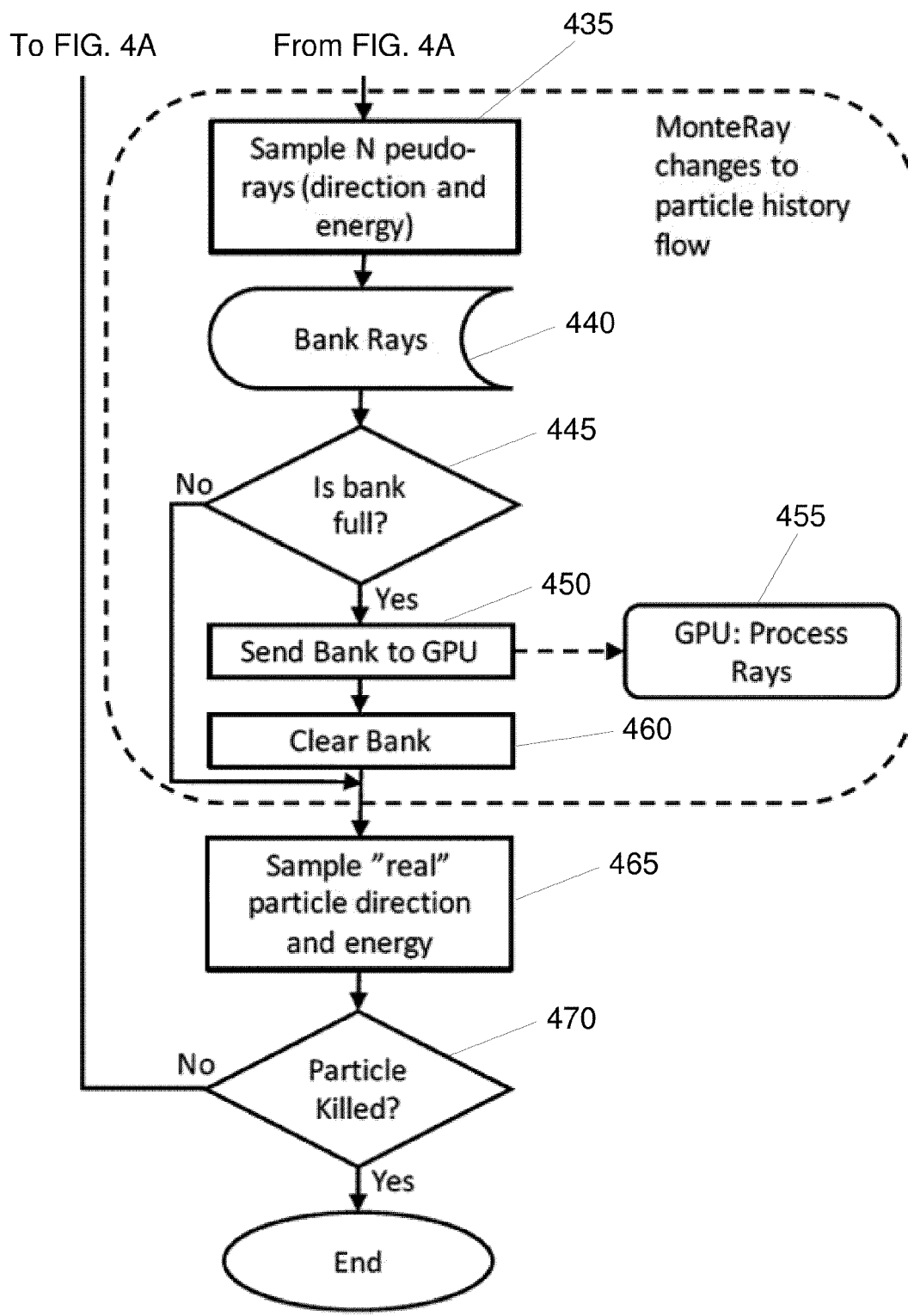

FIGS. 4A and 4B are a flowchart 400 illustrating changes to the Monte Carlo particle history flow for the addition of MonteRay for the calculation of the VRC estimator, according to an embodiment of the present invention. The process beings with sampling a source at 405. The distance to collision at 410 and distance to the geometry boundary 415 are then sampled. If no collision occurred at 420, the process returns to step 410.

However, if a collision occurred at 420, the collision isotope is sampled at 425 and the collision reaction type (i.e., elastic, inelastic, fission, capture, etc.) is sampled at 430. The process then enters the dashed box where MonteRay changes to the particle history flow are made. The direction and energy of N pseudo-rays are sampled at 435 and the rays are banked in a buffer at 440. If the bank is not full at 445, the particle random walk simulation resumes and the "real" particle direction and energy are sampled at 465. The "real" particle direction and energy denotes the random walk particle direction and energy as opposed to the directions and energies of the multiply sampled rays. If the particle is not killed, the process returns to step 410. If the particle is killed, the process for the individual particle ends and a new particle history calculation begins at step 405.

Returning to step 445 above, if the bank is full at 445, the bank is sent to the GPU at 450. The GPU processes the pseudo-rays at 455. The bank is then cleared at 460 and the process proceeds to step 465.

In some embodiments, after the ray buffer was copied to the GPU, the CPU cleared its copy of the ray buffer and resumed the simulation of additional particle histories. While the CPU was busy simulating more particles, the GPU processed the rays stored in the GPU copy of the ray buffer. Each GPU thread processed one individual ray at a time, first calculating all cross-sections, then ray casting the particle, and finally calculating the VRC estimator. In some embodiments, multiple threads process a single ray in a cooperative manner.

FIG. 5 is a flowchart 500 illustrating a process for a GPU implementation of a VRC estimator, according to an embodiment of the present invention. The process begins with retrieving a ray from the bank at 510. The rays that the GPU processes are also referred to herein as "pseudo-rays." This means that these rays do not travel along the same path as the random walk particle (i.e., the "real" particle discussed above). All material cross-sections at the ray energy are looked up at 520 using a hash-based cross-section lookup scheme. The cross-section data may be linearly interpolated between table values.

The particle is then ray traced until it exits the geometry at 530, or until the ray is no longer statistically significant. The expected path length (see Eq. (4)) in each cell crossed is calculated in the loop created by steps 540, 550, 560, 570. The variable i, which is the number of cell crossings, is the loop counter. If the bank is not empty at 580, the process returns to step 510 and the next ray is retrieved. Otherwise, the process ends, and the accelerator is idle until the CPU transfers another ray buffer to the accelerator. The tally remained on the GPU until the termination of the simulation.

All distance to boundary calculations (ray casting) were performed using single-precision floating point data in the example implementation. However, distance to boundary calculations have also been tested with double-precision floating point data with a 30% decrease in performance. The total neutron cross-sections were stored using single-precision floating point data. The calculation of the VRC estimator was performed using double-precision. The use of the double-precision instead of single-precision for the VRC estimator calculation had no measurable effect on computation time using an Nvidia™ GTX TitanX GPU. The neutron fluence rates calculated using single precision ray casting on the GPU were compared with neutron fluence rates calculated using double precision ray casting on the CPU for each test problem.

Evaluation of the VRC Estimator

The efficiency of Monte Carlo variance reduction techniques and tally methods are typically measured using a figure of merit (FOM), which accounts for both the computation time and the obtained tally variance. The FOM is defined as:

$$FOM = \frac{1}{\sigma^2 T} \qquad (5)$$

where $\sigma^2$ is the variance of the tally and T is the computational time (the standard deviation of the tally mean, $\sigma$, is the square root of the variance). A larger FOM indicates a more efficient method. To measure the performance of the VRC estimator ($\eta$), the ratio of the VRC estimator FOM ($FOM_{RTE}$) to the TL estimator FOM ($FOM_{TLE}$) was used.

$$\eta = \frac{FOM_{RTE}}{FOM_{TLE}} = \frac{\sigma^2_{TLE}}{\sigma^2_{RTE}} \frac{T_{TLE}}{T_{RTE}} \qquad (6)$$

The time used in Eq. (6) was the time used for the particle transport portion of the calculations. The problem setup and finalization portions were not included in the timings as they should be nearly equivalent for both methods. Additionally, the calculations were sufficiently long that the problem setup and finalization portions used negligible time compared to the particle transport portion. Timings were performed with the C "clock_gettime" system call. Timings ranged from a minimum of 23 seconds to a maximum of 3536 seconds.

The performance of the VRC estimator was evaluated for 1-20 CPU cores matched with a GPU. The TL estimator FOM was measured with the same number of CPU cores. As a reference, the Titan™ supercomputer at ORNL currently uses 16 CPU cores per GPU (Titan™). It is expected that future GPU accelerated supercomputers will have 8-12 CPU cores per GPU. The performance for both a single CPU core matched with a GPU and for eight CPU cores matched with a CPU is discussed herein as reference points. Additionally, the performance of the VRC estimator for other numbers of CPU cores matched to a GPU have been included in tables and figures herein.

CPU timings were performed using 10-core Intel™ Haswell CPUs (E5-2660 v3) running at 2.60 GHz. There were two CPUs (20 total cores) per compute node. The GPU timings were performed using the same two Intel™ Haswell CPUs paired with a GeForce™ GTX TitanX GPU, which uses the Nvidia™ Maxwell architecture. The TitanX GPU has 3072 CUDA cores operating at 1.0 GHz and has 12 GB of memory. An Nvidia™ Tesla K40 was also tested, but this unit was two times slower than the TitanX.

Three test problems were considered: (1) a 16×16 pressurized water reactor (PWR) fuel assembly; (2) a simulation of a criticality accident in a concrete room; and (3) a model of the reflected Godiva criticality benchmark problem. In all three cases, the neutron fluence was calculated with the VRC estimator and the TL estimator, and their relative performance was compared.

In order to validate the use of single-precision ray casting for calculation of the VRC estimator on the GPU, comparisons have been made to double-precision ray casting for VRC estimator calculations on the CPU. Two metrics were used for this comparison. The relative difference in the neutron fluence between ray casting in single-precision on the GPU and ray casting in double-precision on the CPU is $\Delta_\phi$ (i):

$$\Delta_\phi(i) = \frac{|\phi_{CPU}(i) - \phi_{GPU}(i)|}{\phi_{CPU}(i)} \quad (7)$$

where $\phi_{CPU}(i)$ is the neutron fluence in cell i calculated with double-precision ray casting on the CPU and $\phi_{CPU}(i)$ is the neutron fluence in cell i calculated with single-precision ray casting on the GPU. The relative difference gives a measure of the difference that can be compared between cells of varying magnitudes.

The second metric is the fractional difference, $\varepsilon_\phi(i)$, which is the ratio of the absolute difference to the standard deviation of the fluence:

$$\varepsilon_\phi(i) = \frac{|\phi_{CPU}(i) - \phi_{GPU}(i)|}{\sigma(i)} \quad (8)$$

where $\sigma(i)$ is the standard deviation of the fluence in cell i. The fractional difference indicates whether the difference is statistically significant.

16 × 16 Pwr Fuel Assembly

Figure 6:
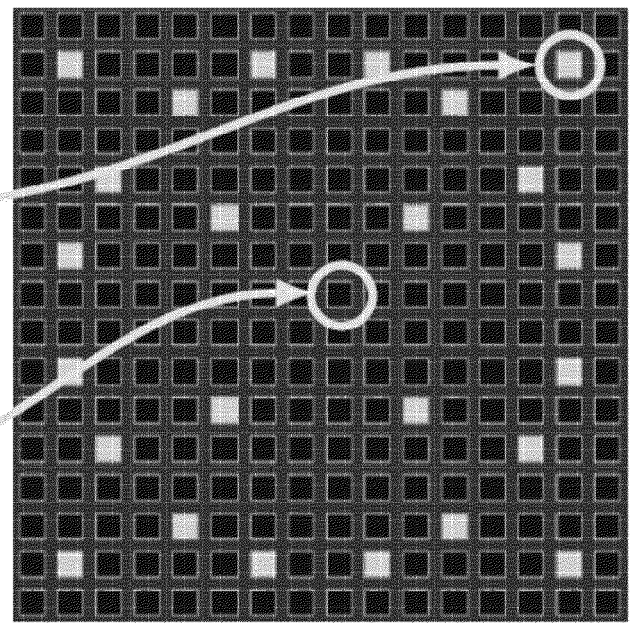
FIG. 6 illustrates a 16 × 16 PWR fuel assembly test geometry with rectangular fuel pins.

A 16 × 16 PWR fuel assembly, converted to rectangular geometry, was used to evaluate the VRC estimator for the simulation of light water reactors. See PWR fuel assembly 600 of FIG. 6. In PWR fuel assembly 600, with rectangular fuel pins (dark gray squares), control rods (light gray squares), and water moderator (area between the squares) are shown. The performance of the VRC estimator was tested for tallies within the central fuel pin and corner control rod indicated by the circles.

As MonteRay does not have reflective boundaries, the assembly was placed within a solution of uranyl nitrate and this was reflected with graphite. The control rod pins consisted of $B_4C$ with 20 atomic percent Boron-10. The fuel was $UO_2$ with 5 atomic percent enriched U-235. The geometry was specified with a 0.6 mm × 0.6 mm × 1000 mm mesh spacing within the assembly. The entire mesh, including the uranyl nitrate solution and graphite, used 340 × 340 × 5 cells. Total neutron fluence tallies were performed on the same mesh.

Performance Versus Number of CPU Cores

Figure 7:
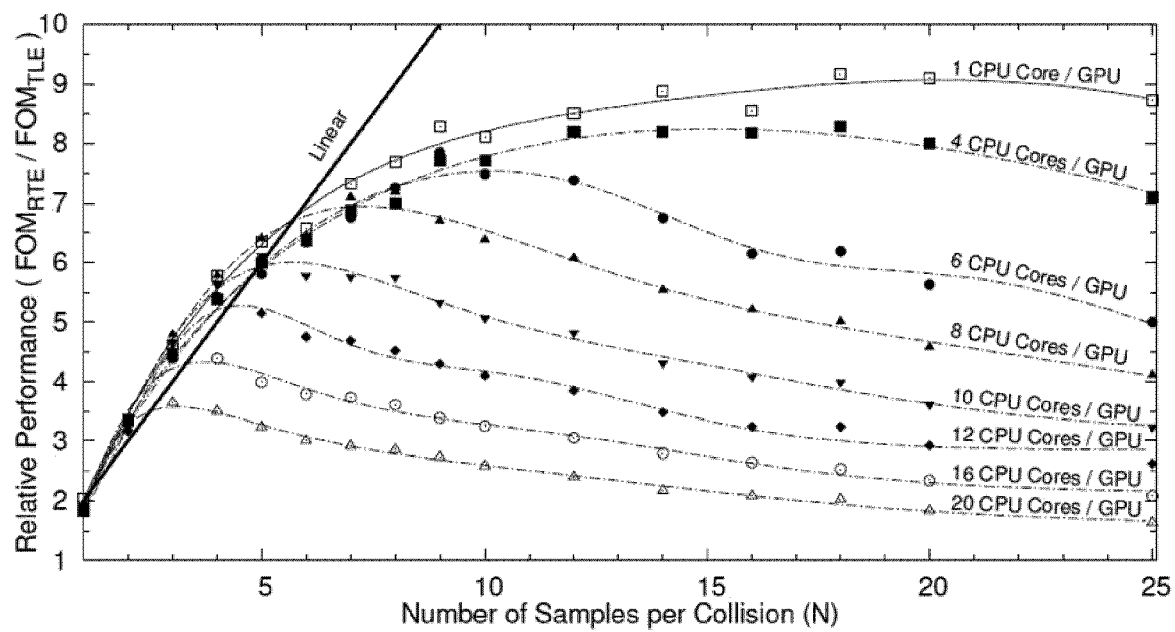
FIG. 7 is a graph illustrating performance of a VRC estimator for a corner control rod tally of the PWR 16 × 16 fuel assembly shown in FIG. 6 as a function of the number of ray samples per collision, according to an embodiment of the present invention.

Two regions within the fuel assembly were evaluated to determine the effectiveness of the ray trace tally: a central fuel pin and a corner control rod. PWR fuel assembly 600 of FIG. 6. The average variances within these two regions was used to evaluate the performance of the VRC estimator. The performance was evaluated using MCATK's static $k_{eff}$ eigenvalue solution mode with 40,000 particles per cycle, 20 inactive cycles, and 40 active cycles. The performance was assessed as a function of both the number of rays sampled per collision and the number of CPU cores per GPU. See graph 700 of FIG. 7.

For a single CPU core per GPU, the VRC estimator obtained maximum performance using 184 ray samples per collision. For eight CPU cores per GPU, the maximum performance was obtained using 7 ray samples per collision. The maximum performance was obtained when the GPU computation time matched the CPU computation time. The performance increase was approximately linear for small numbers of ray samples per collision. This indicates that in this range each ray sample was as effective as an independent random walk particle.

Figure 8:
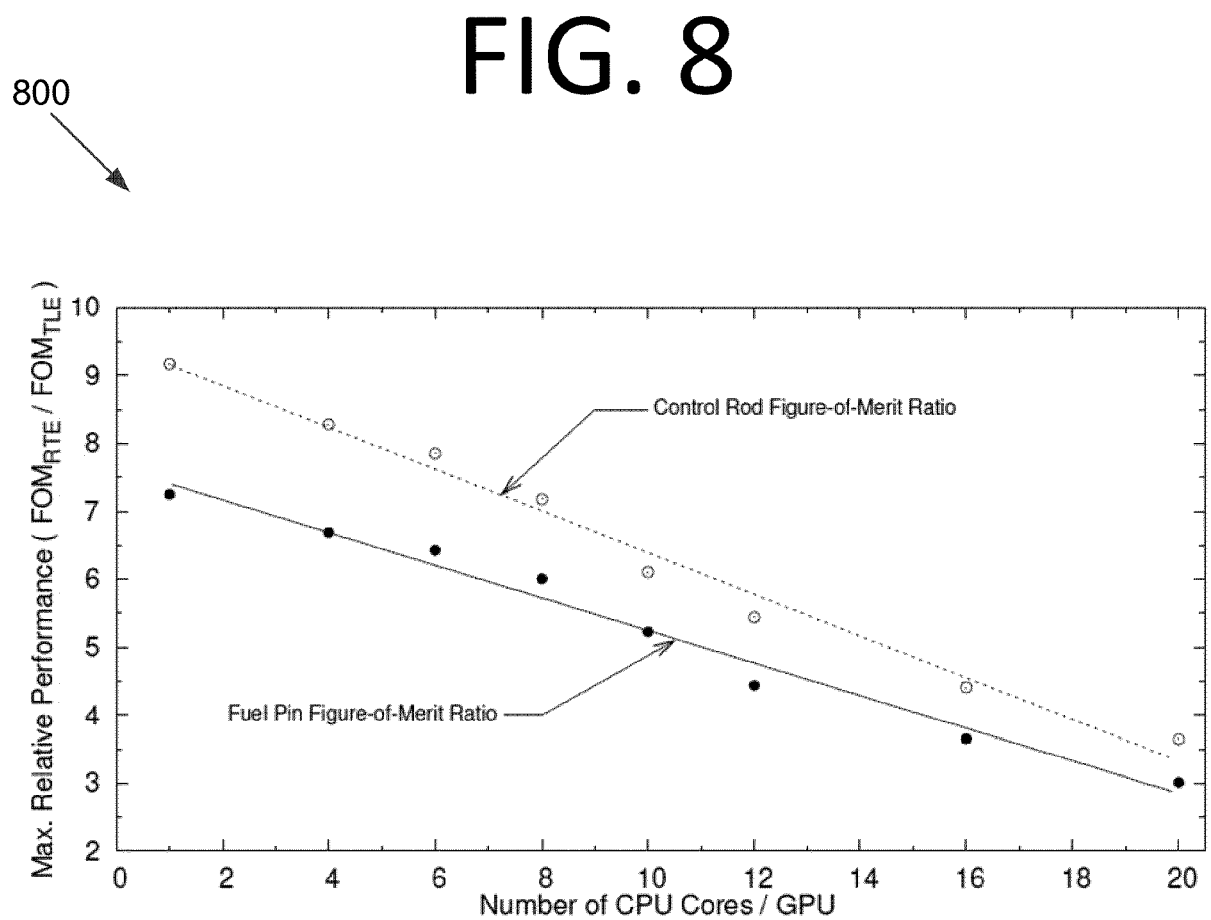
FIG. 8 is a graph illustrating maximum performance of the VRC estimator for the PWR 16 × 16 fuel assembly shown in FIG. 6 assembly as a function of the number of CPU cores paired to a GPU, according to an embodiment of the present invention.

The maximum performance of the VRC estimator is approximately a linear function of the number of CPU cores per GPU. See graph 800 of FIG. 8. The VRC estimator obtained performance increases in the corner control rod of 9.2 and 7.2 for one and eight CPU cores per GPU, respectively. In the fuel pin, the performance increases were 7.3 and 6.0, respectively.

Equal Time Comparison

In another test using the PWR assembly model, the TL estimator and VRC estimator were executed for equal wall clock times of 600 seconds. Thus, the ratio of time in Eq. (6) was unity and the VRC estimator performance was simply the ratio of the Monte Carlo variances. The TL estimator calculation used 40,000 particles per cycle, 124 active cycles, and 20 inactive cycle on 8 CPU cores. The VRC estimator calculation used 40,000 particles per cycle, 93 active cycles, 20 inactive cycles, and 8 rays per collision with 8 CPU cores and a single GPU.

Figure 9A:
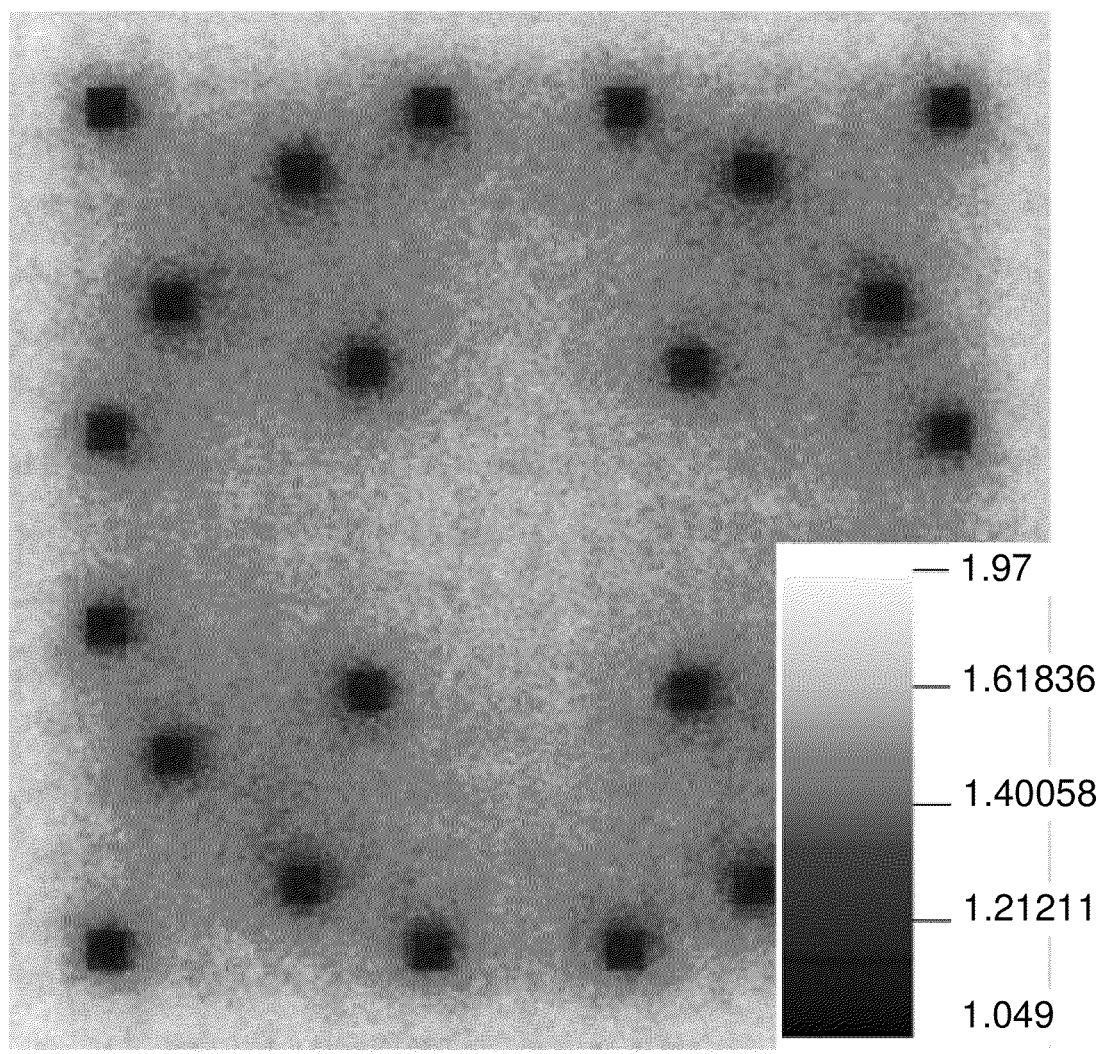
FIG. 9A is an image illustrating TL estimator fluence (n • {fission n}$^{-1}$ • cm$^{-2}$ • 10$^{-4}$).
Figure 9B:
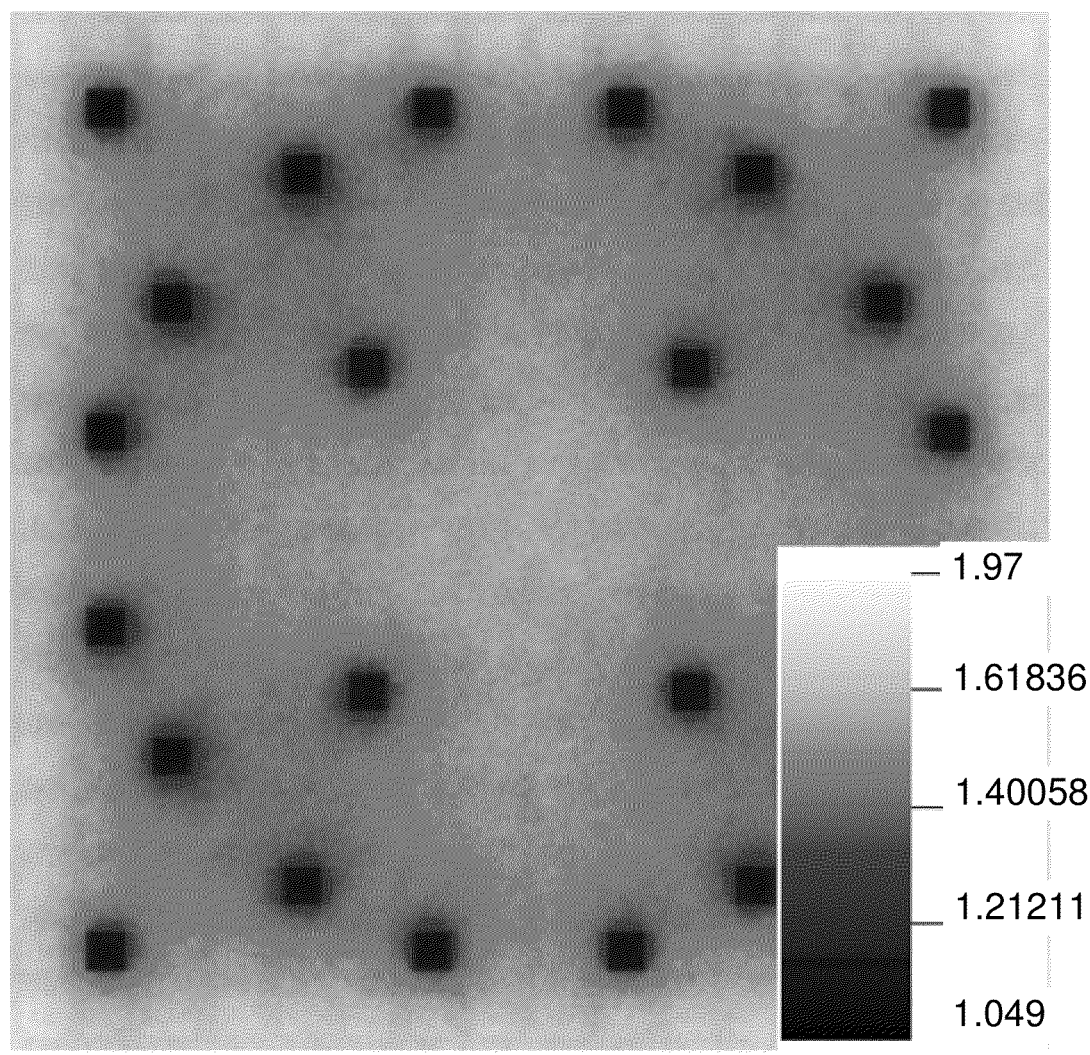
FIG. 9B is an image illustrating VRC estimator fluence (n • {fission n}$^{-1}$ • cm$^{-2}$ • 10$^{-4}$), according to an embodiment of the present invention.
Figure 9C:
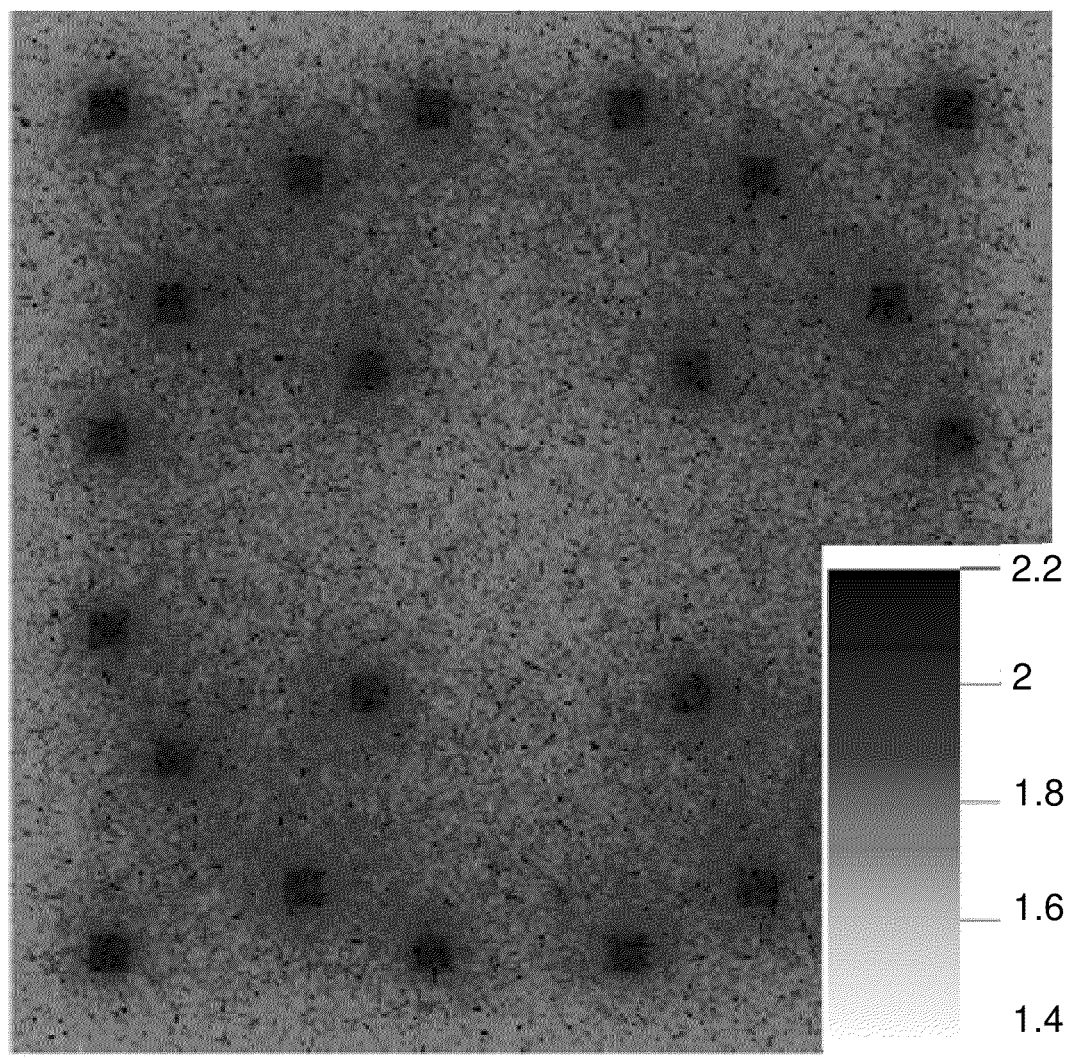
FIG. 9C is an image illustrating TL estimator relative uncertainty, $\sigma_{TLE}$ (%).
Figure 9D:
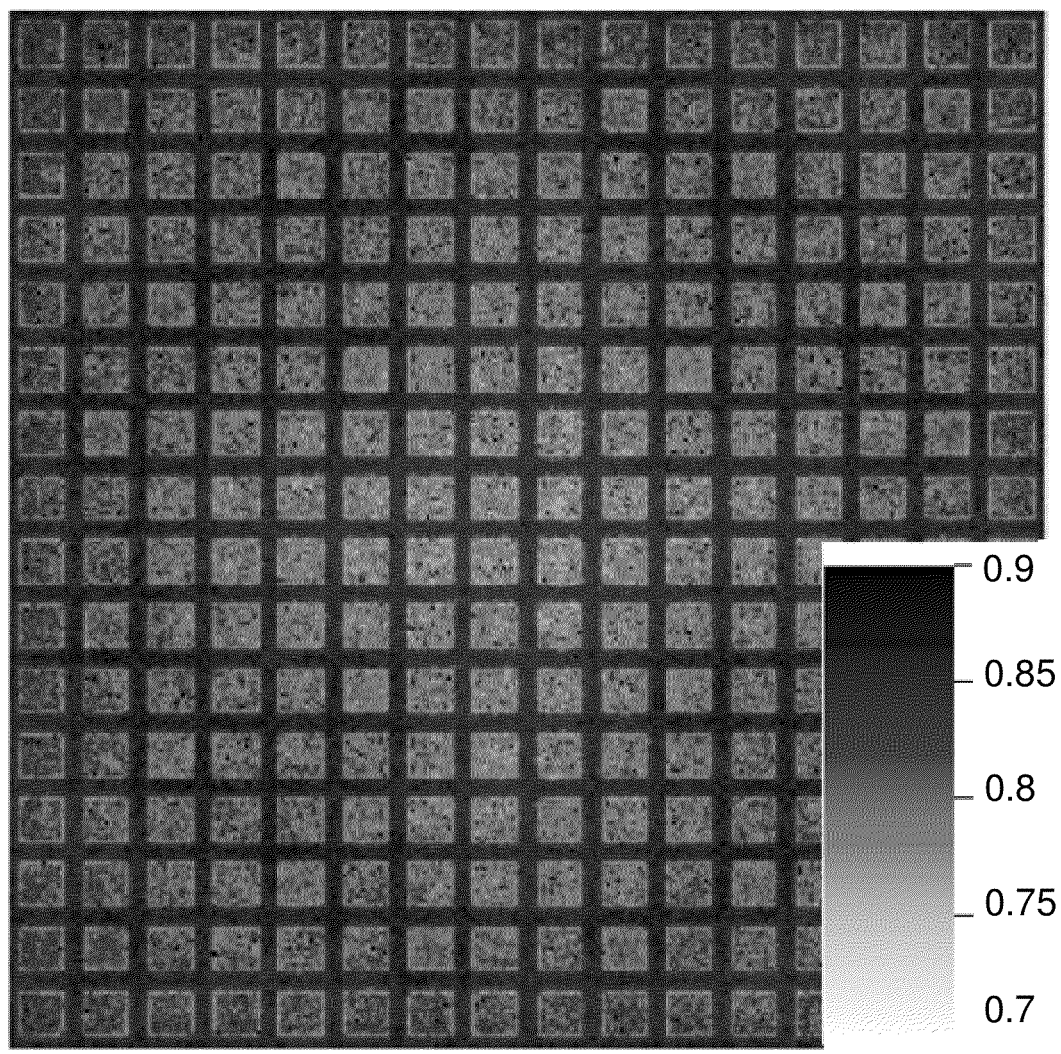
FIG. 9D is an image illustrating VRC estimator relative uncertainty, $\sigma_{TLE}$ (%), according to an embodiment of the present invention.
Figure 9E:
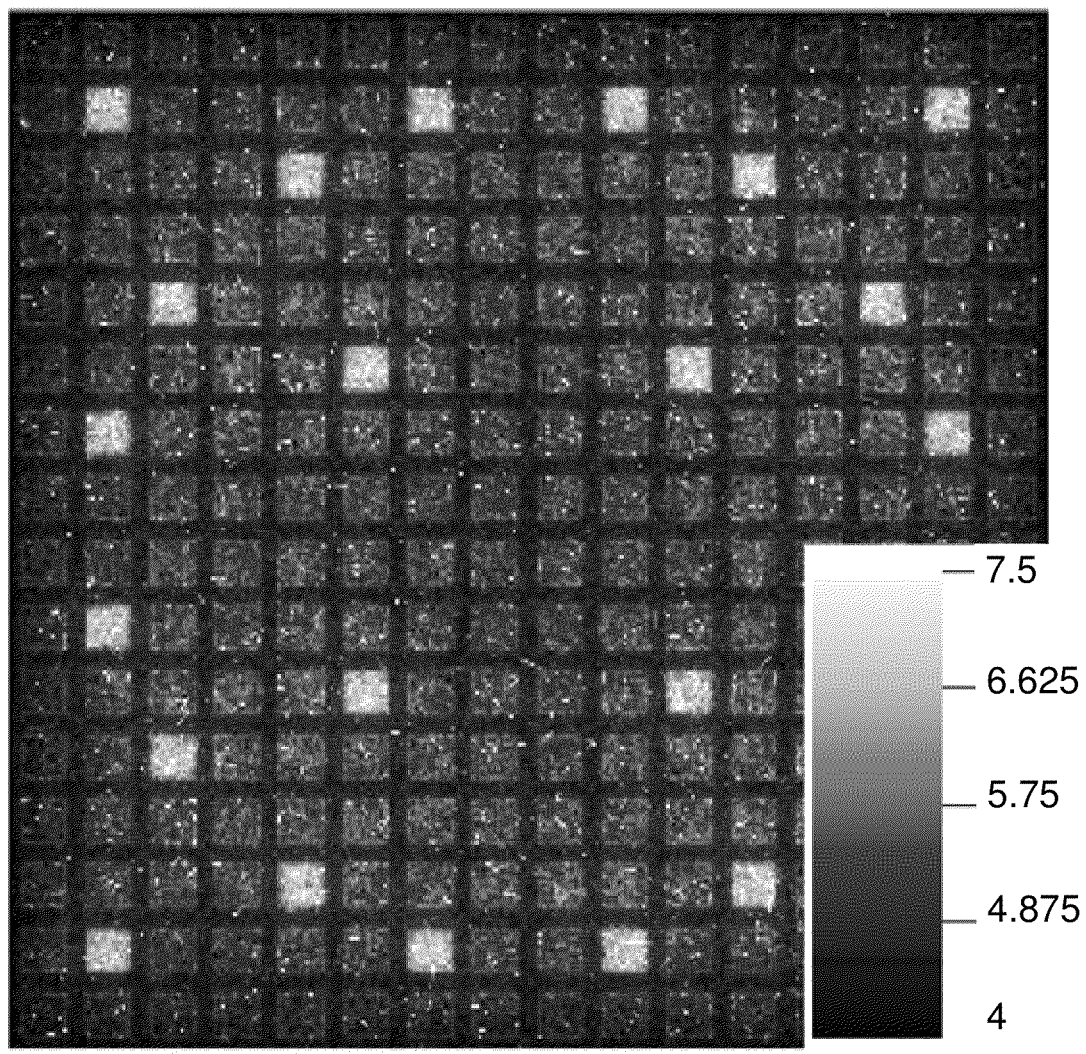
FIG. 9E is an image illustrating VRC estimator performance, $\eta$, according to an embodiment of the present invention.

The VRC estimator generated fluence results were generally less noisy than the TL estimator results. Compare images 900, 910 of FIGS. 9A and 9B. The spatial distribution of the VRC estimator uncertainty was considerably different and significantly lower than the TL estimator uncertainty. Compare images 920, 930 of FIGS. 9C and 9D. While the TL estimator uncertainty was inversely proportional to the neutron fluence, the VRC estimator uncertainty was not (note that the color scale, converted to grayscale herein, of the uncertainty plots has been inverted from the color bar of the neutron fluence plots to show the inverse relationship). The VRC estimator had the highest uncertainty in the water moderator and the TL estimator had the highest uncertainty in the control rods. The performance of the VRC estimator has been calculated on a cell-by-cell basis. See image 940 of FIG. 9E. The best performance increase was in the control rods and the lowest performance increase was in the water moderator.

Single-Precision Versus Double-Precision

For the PWR fuel assembly, the maximum relative difference ($\Delta_\phi$) was 0.0018% and the maximum fractional difference ($\varepsilon_\phi$) was 0.23%. As the maximum difference ($\varepsilon_\phi$) was much less than 100%, this indicated that the differences were negligible.

Criticality Accident

Figure 10:
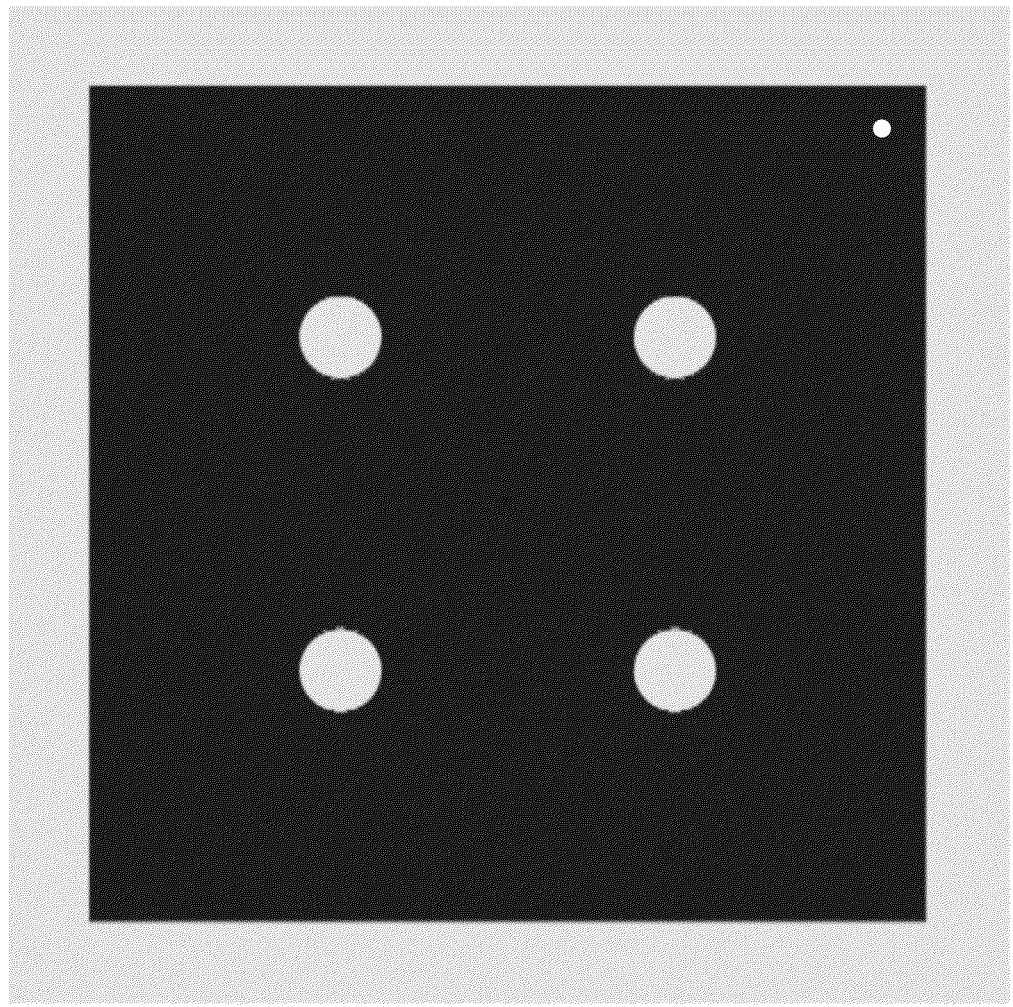
FIG. 10 illustrates a plan view of the geometry of a room in a criticality accident scenario, according to an embodiment of the present invention.

To evaluate the performance of the VRC estimator in the context of radiation protection, a criticality accident has been simulated. The criticality accident was modeled with a sphere of U-235 placed in the upper right corner of a concrete room. See room 1000 of FIG. 10. The interior room was 10 meters wide × 10 meters long × 2 meters high and filled with air (darker gray square). The concrete walls, floor, and ceiling of the room were 1 meter thick (lighter gray box around the outside). Four 50-cm radius concrete columns (larger circles) were placed in the rooms. A mesh of 400 × 400 × 50 cells was used to model the room.

Performance Versus Number of CPU Cores

To evaluate the performance of the VRC estimator the total neutron fluence was calculated with the VRC estimator and the TL estimator using MCATK's $k_{eff}$ eigenvalue solution mode with 40,000 particles per cycle, 50 active cycles, and 5 inactive cycles. The average variance, in the mesh cells contained by a 50 cm radius sphere in the center of the room, was used to evaluate the performance of the VRC estimator.

Figure 11:
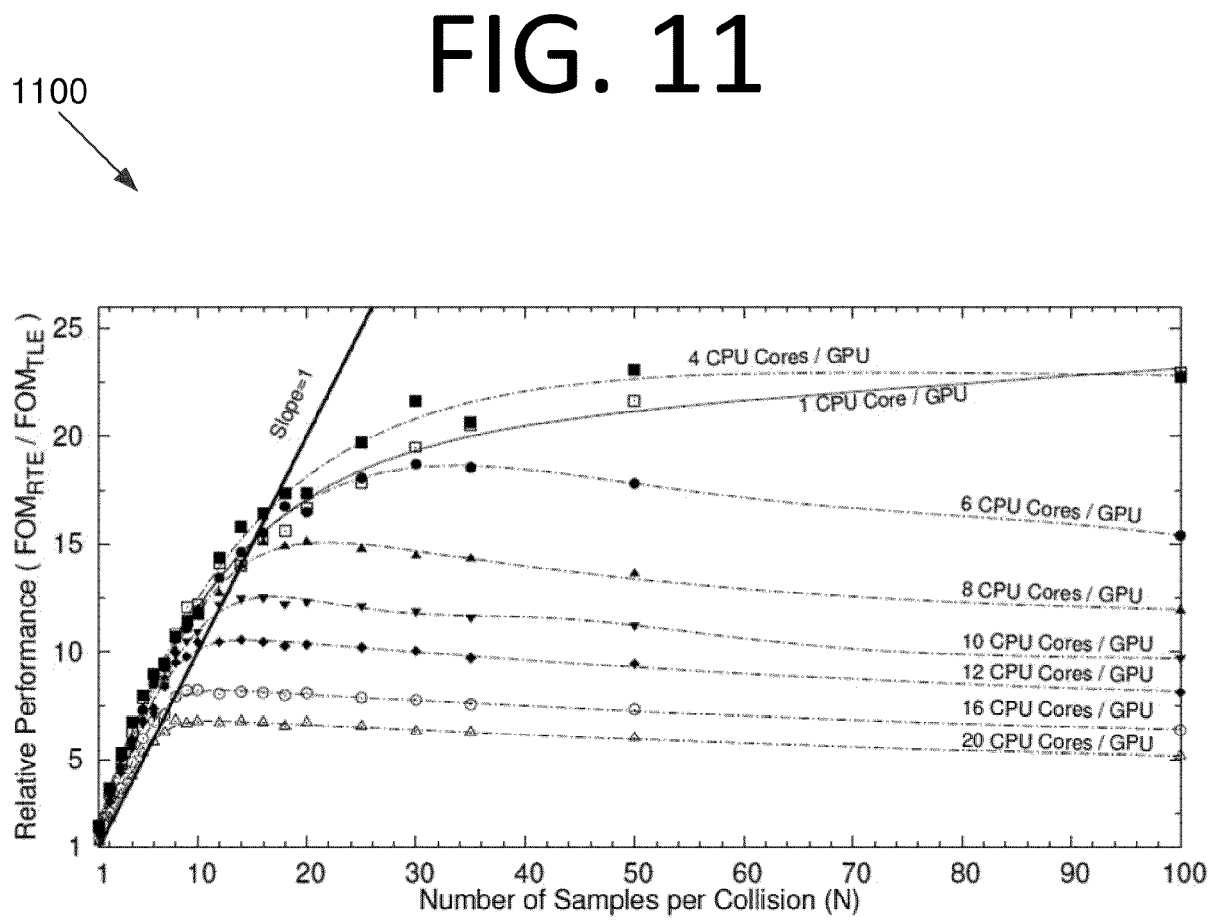
FIG. 11 is a graph illustrating the performance of the VRC estimator as a function of the number of ray samples per collision for the criticality accident scenario, according to an embodiment of the present invention.

Again, the performance was assessed as a function of both the number of rays sampled per collision and the number of CPU cores per GPU. See graph 1100 of FIG. 11. For a single CPU core per GPU, the VRC estimator had the highest measured performance using 100 ray samples per collision. A larger number of rays per collision was not measured as larger number of CPU cores per GPU had maximum performance with less than 100 samples per collision. For eight CPU cores per GPU, the maximum performance was obtained using 20 ray samples per collision.

Figure 12:
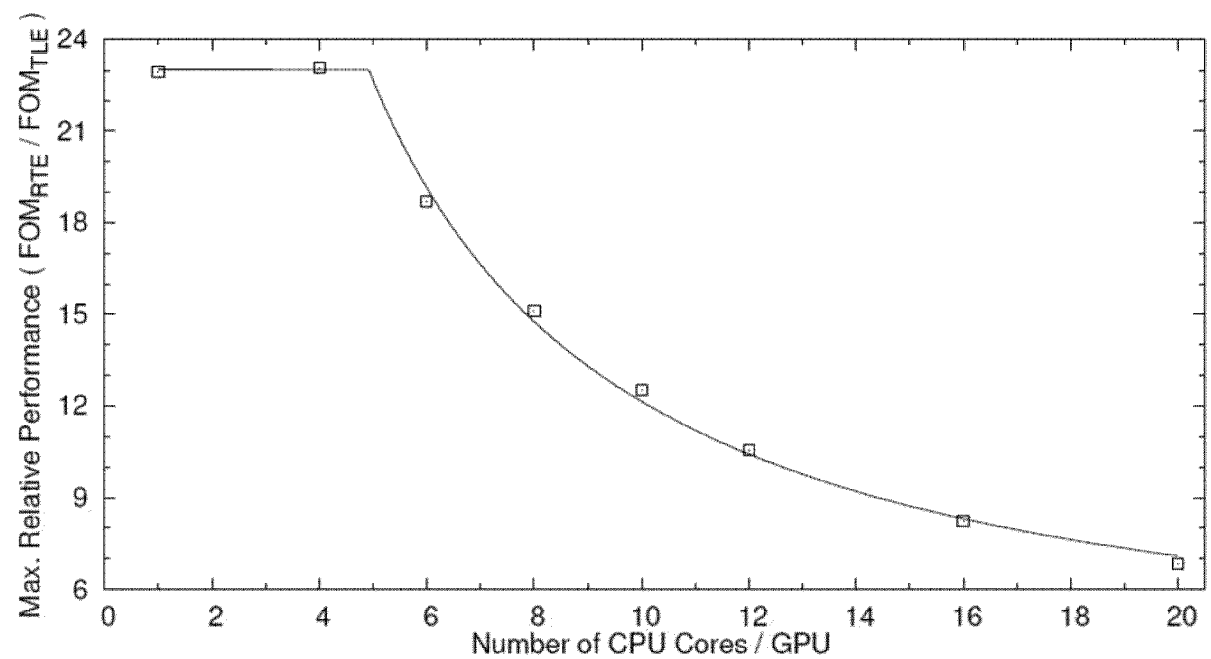
FIG. 12 is a graph illustrating the maximum performance of the VRC estimator as a function of the number of CPU cores per GPU for the criticality accident scenario, according to an embodiment of the present invention.

The maximum performance of the VRC estimator is constant up to four CPU cores per GPU. See graph 1200 of FIG. 12. With more than four CPU cores per GPU, the performance is inversely proportional to the number of CPU cores. The performance increase as measured in the center of the room was 23.0 and 15.1 for one and eight CPU cores per GPU, respectively.

The VRC estimator performance on the CPU was also assessed as a function of the number of rays sampled per collision. Compared to the TL estimator, the VRC estimator on the CPU had a maximum performance increase of 1.24 times with 12 ray samples per collision.

Equal Time Comparison

Figure 13A:
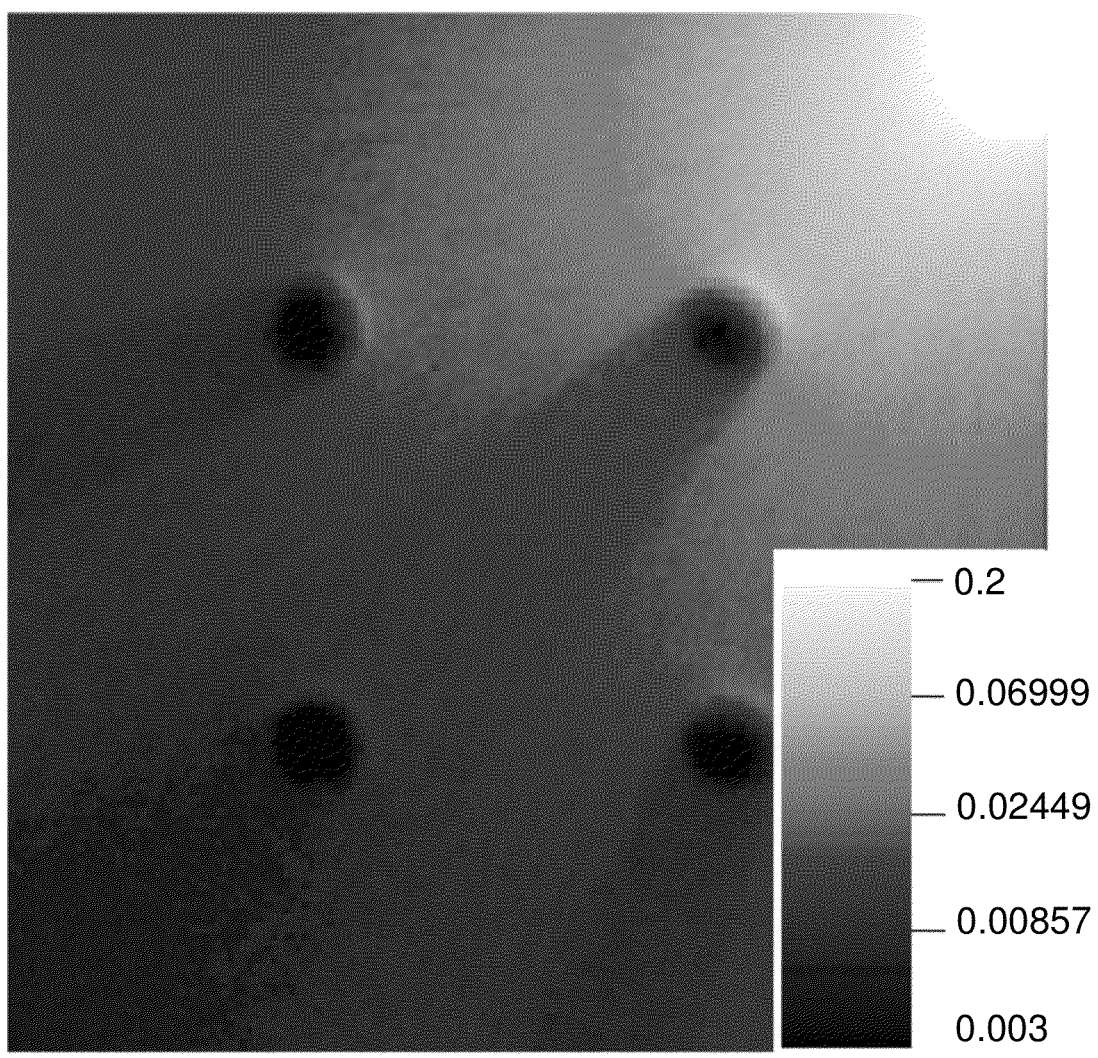
FIG. 13A is an image illustrating TL estimator fluence (n • {fission n}$^{-1}$ • cm$^{-2}$ • 10$^{-4}$).
Figure 13B:
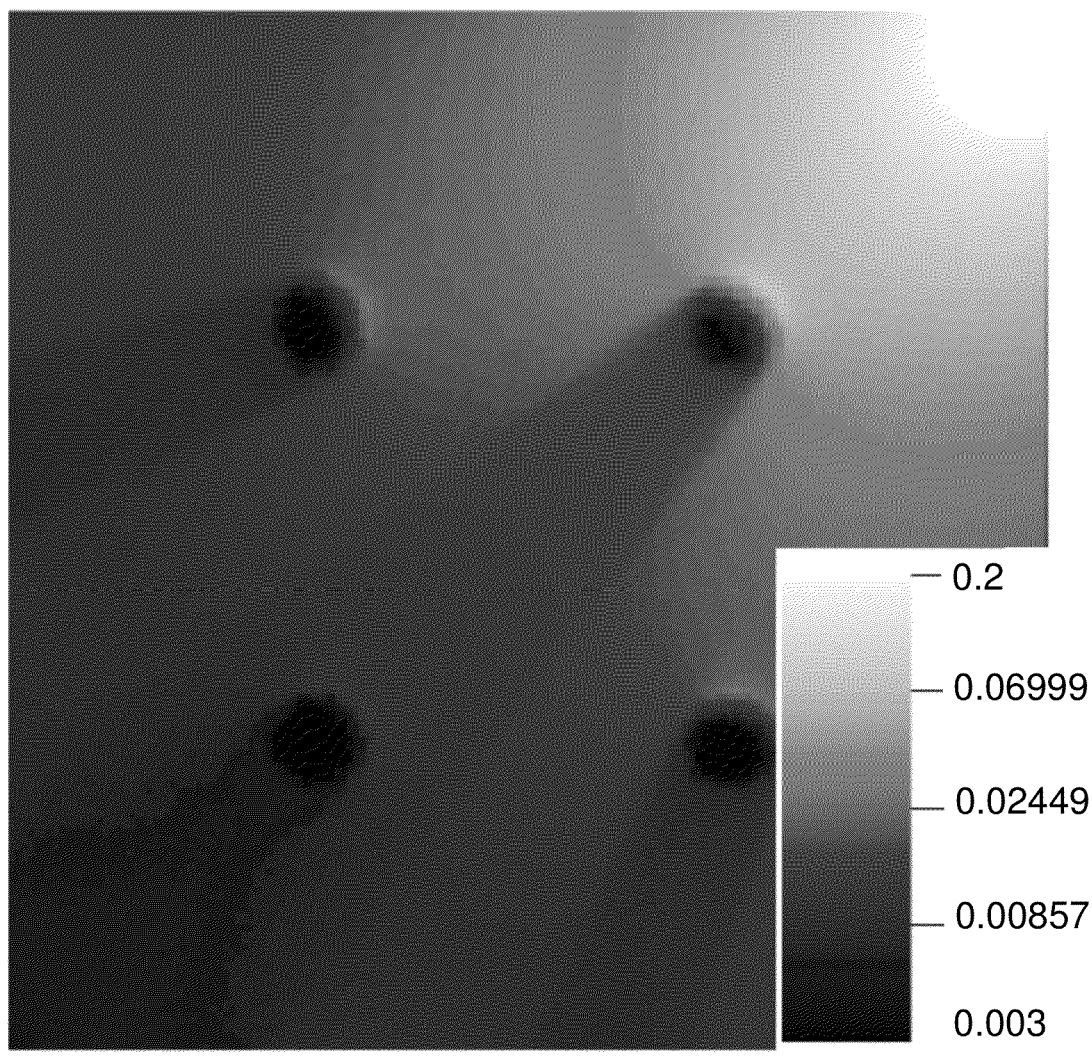
FIG. 13B is an image illustrating VRC estimator fluence (n • {fission n}$^{-1}$ • cm$^{-2}$ • 10$^{-4}$), according to an embodiment of the present invention.
Figure 13C:
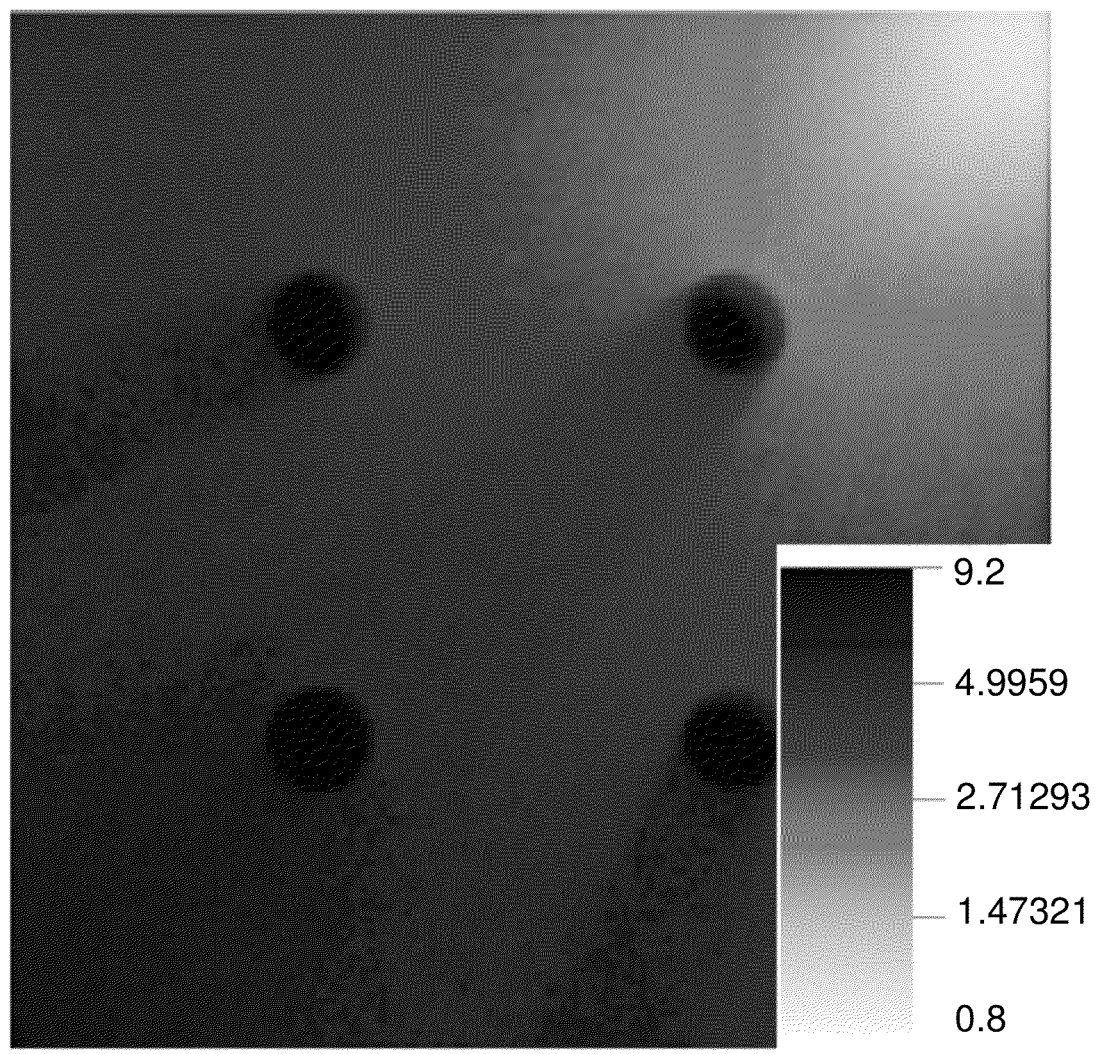
FIG. 13C is an image illustrating TL estimator relative uncertainty, $\sigma_{TLE}$ (%).
Figure 13D:
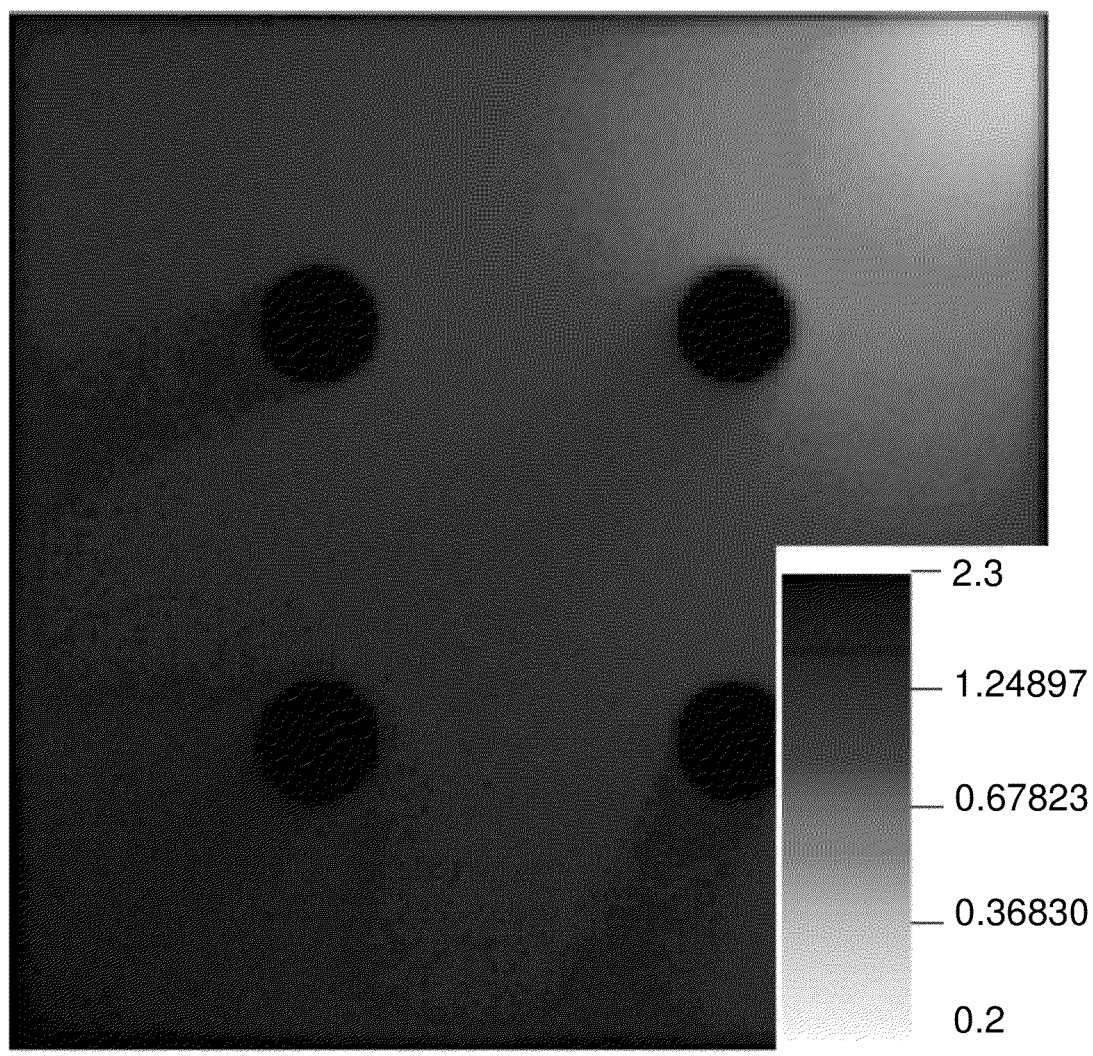
FIG. 13D is an image illustrating VRC estimator relative uncertainty, $\sigma_{TLE}$ (%), according to an embodiment of the present invention.
Figure 13E:
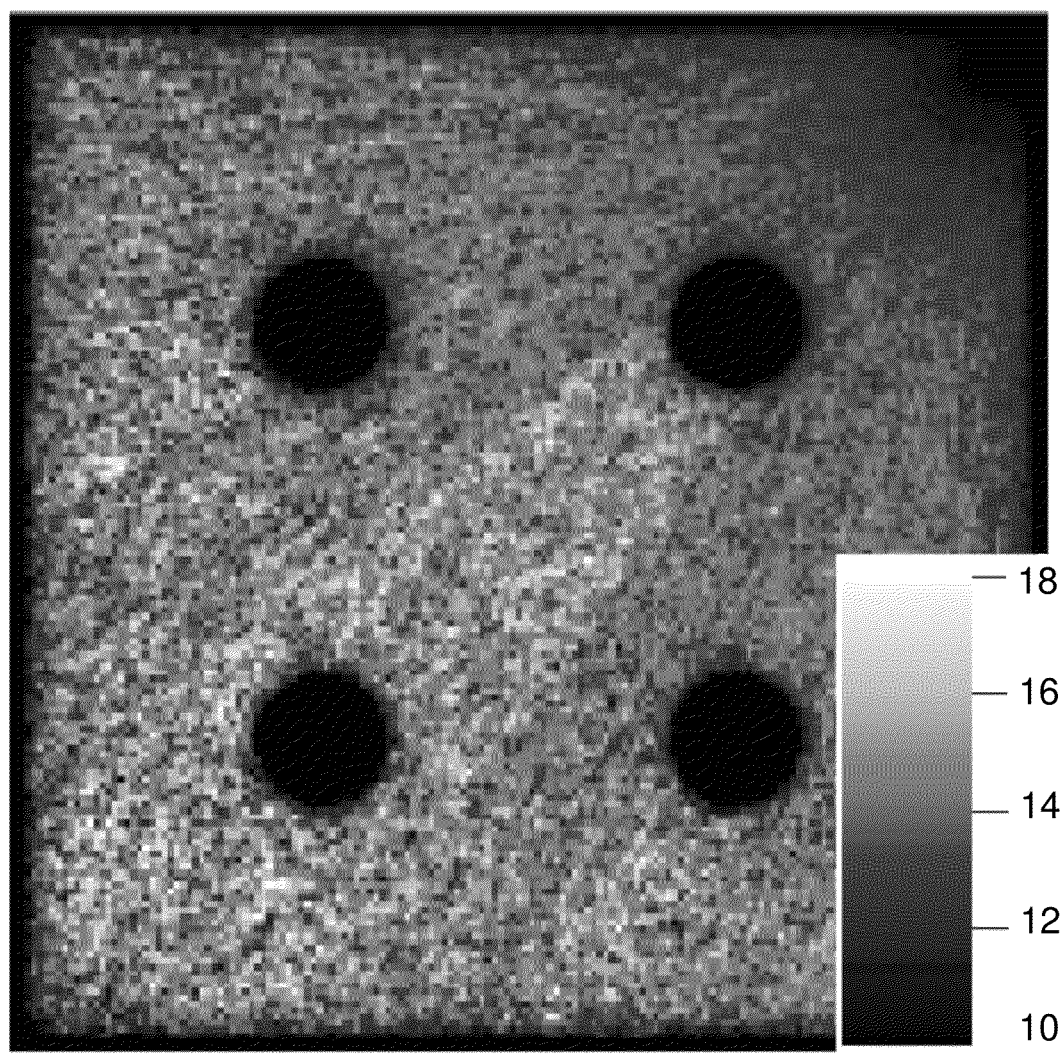
FIG. 13E is an image illustrating VRC estimator performance, $\eta$, according to an embodiment of the present invention.

Again, the criticality accident scenario was simulated with both methods for equal time (645 seconds) using 8 CPU cores. The TL estimator calculation used 40,000 particles per cycle, 151 active cycles, and 5 inactive cycles. The VRC estimator calculation used 40,000 particles per cycle, 63 active cycles, 5 inactive cycles, and 20 rays per collision. The VRC estimator produced a much smoother neutron fluence than the TL estimator. Compare images 1300, 1310 of FIGS. 13A and 13B. Rays from individual particles are clearly seen in the TL estimator fluence, but have been smoothed out in the VRC estimator fluence. The neutron shadows of the VRC estimator fluence have sharp edges that are not as clearly defined with the TL estimator. The Monte Carlo uncertainty of the VRC estimator and the TL estimator follow the same general trends. Compare images 1320, 1330 of FIGS. 13C and 13D. However, the uncertainty of the VRC estimator is generally 4 times lower than the uncertainty of the TL estimator (the color scale of the TL estimator, converted to grayscale herein, is 4 times the color scale of the VRC estimator). As variance is the square of the uncertainty, this results in a performance of 16 times. A plot ratio of the VRC estimator performance indicates that performance was generally 12 to 18 for locations in air. See image 1340 of FIG. 13E.

Single-Precision Versus Double-Precision

The VRC estimator fluence values calculated with single-precision ray casting on the GPU was again compared to VRC estimator fluence values calculated with double-precision on the CPU. As the cells in the concrete columns have very poor statistics, with as much as 100% uncertainty, it is not surprising to find some differences in these fluence values. There were 3 cells out of 2 million cells that had relative differences that were larger than 1%. However, none had differences larger than the uncertainty. The uncertainty in these 3 cells was extremely poor – greater than 71%. Six other cells had only a single particle track contribute to their fluence estimate and also had relative differences greater than 1%, but the uncertainty is not defined for a single sample. These differences seem to indicate slight ray casting differences, which is to be expected even for double precision implementations on different hardware.

More meaningful results can be obtained by only examining the differences in cells with statistically significant fluence tally estimates — cells with uncertainties less than 5%. The maximum relative difference ($\Delta_\phi$) was 0.0011% for these cells. The maximum fractional difference ($\varepsilon_\phi$) was also very low for the criticality accident scenario — less than 0.1%.

Reflected Godiva Criticality Benchmark

Simulation of the Reflected Godiva criticality benchmark (ICSBEP Handbook) was performed to demonstrate the performance of the VRC estimator in optically thick systems. The Reflected Godiva benchmark was modeled as a 6.5 cm radius, highly enriched, uranium metal core surrounded by a sphere of water with a 33.3 cm radius. The geometry was modeled using 100 × 100 × 100 cells with a Cartesian mesh.

Performance Versus Number of CPU Cores

Figure 14:
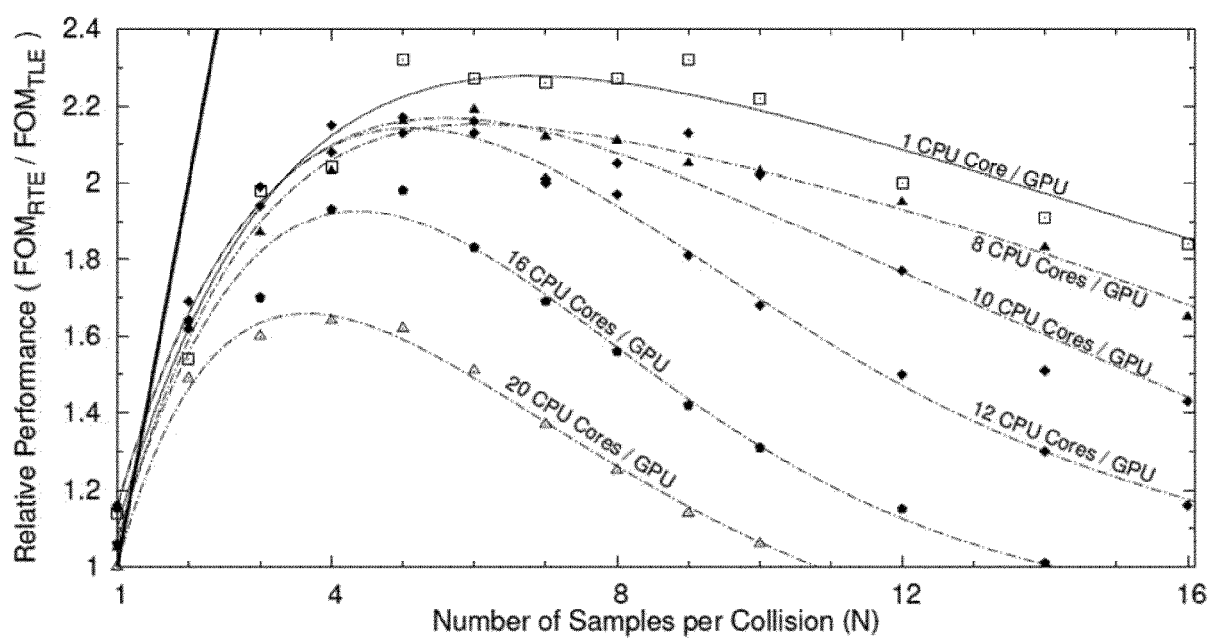
FIG. 14 is a graph illustrating the performance of the VRC estimator as a function of the number of ray samples per collision for Reflected Godiva (performance was measured using the average variance in a 1 cm radius spherical region located at the center of the metal core), according to an embodiment of the present invention.

The performance of the VRC estimator was assessed using 40,000 particles per cycle, 25 active cycles, and 10 inactive cycles. The average variance in a 1 cm radius sphere at the center of the metal core was used to calculate the performance. See graph 1400 of FIG. 14. Using a single CPU core per GPU, the VRC estimator had the highest measured performance using between 5 and 9 rays per collision (5 and 9 rays per collision provided the same FOM). Using eight CPU cores per GPU, the maximum performance was obtained using 6 rays per collision.

Figure 15:
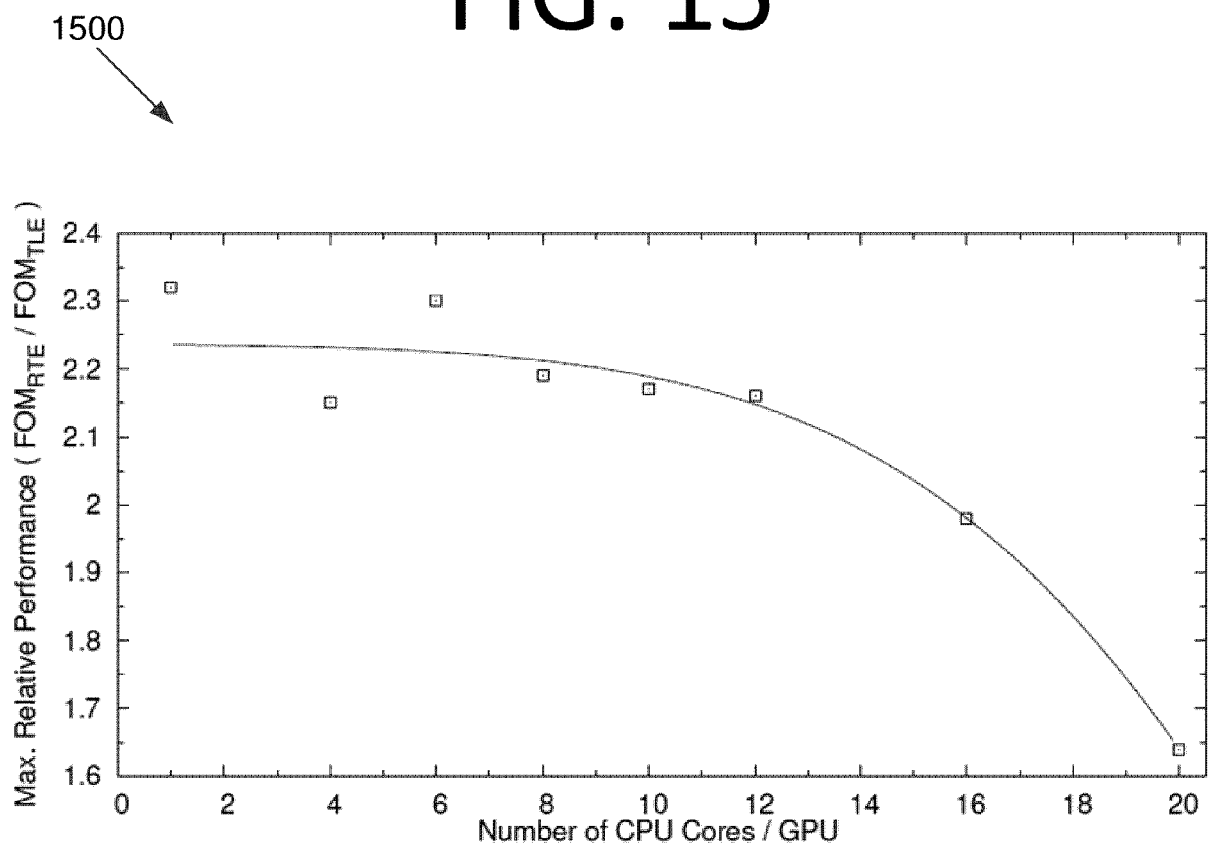
FIG. 15 is a graph illustrating the performance of the VRC estimator as a function of the number of CPU cores per GPU for Reflected Godiva, according to an embodiment of the present invention.

The maximum performance of the VRC estimator as a function of the number of CPU cores was relatively constant up to 12 cores. See graph 1500 of FIG. 15. The maximum performance was 2.3 and 2.2 for 1 and 8 cores, respectively. For this example problem, the performance of the VRC estimator is limited by method and not by the ray trace rate of the GPU.

Equal Time Comparison

Figure 16:
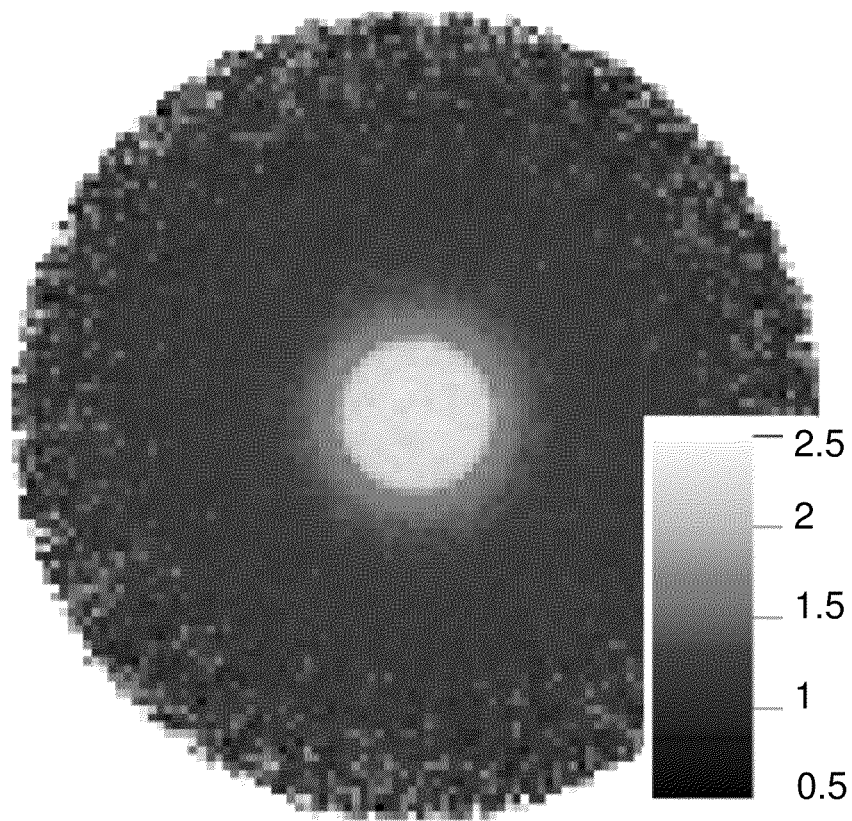
FIG. 16 is an image illustrating VRC estimator performance for simulations of equal time (600 seconds) for the Reflected Godiva benchmark where both the VRC estimator and TL estimator calculations used 8 CPU cores, according to an embodiment of the present invention.

The reflected Godiva criticality benchmark was simulated using both methods for 600 seconds with 8 CPU cores. The calculation with the TL estimator used 40,000 particles per cycle, 241 active cycles, and 10 inactive cycles. The calculation with the VRC estimator used 40,000 particles per cycle, 168 active cycles, 5 inactive cycles, and 6 rays per collision. The fluence and Monte Carlo uncertainty distributions were similar for these two calculations. Only the magnitude of the uncertainty was different. Thus, the plots of the fluence and the uncertainty have not been included. The performance of the VRC estimator within the water reflector is approximately one, while the performance within the uranium metal is between 2.0 and 2.5. See image 1600 of FIG. 16.

Single-Precision Versus Double-Precision

The maximum relative difference in single-precision results on the GPU and double precision results on the CPU for the 1 million cells was 0.14%. However, there were many cells with large uncertainties in the outer edge of the water reflector. The maximum relative difference ($\Delta_\phi$) in the cells with statistically significant fluence estimates, less than 5% uncertainty, was 0.0015%. The maximum fraction difference ($\varepsilon_\phi$) was less than 0.07%.

VRC Estimator Performance and Advantages

The VRC estimator demonstrates that porting the Monte Carlo random walk to accelerators may not provide the best performance. Rather, it shows that the best performance is obtained when the accelerator and CPU work together. Otherwise, the significant computational power of the CPUs found in today's leadership class HPC machines is largely wasted.

The VRC estimator of some embodiments can be introduced into an existing Monte Carlo transport code as a library without significant changes to the Monte Carlo code base. This significantly reduces the cost of enabling Monte Carlo codes to utilize GPU hardware and maintains the verification and validation history of the software. The VRC estimator has been shown to provide significant performance increases of Monte Carlo neutron transport using GPU accelerators. The performance of the method of some embodiments does vary based on the nature of the problem simulated.

The VRC estimator shows the best performance for simulations having cells that are optically thin, such as problems in the areas of radiation protection and atmospheric transport. It shows the worst performance for simulations having cells that are optically thick. For a criticality accident scenario, where the neutron fluence in air was calculated within a concrete room, a performance improvement of 23 times was obtained for a single CPU core paired with a GPU. See Table 2 below.

TABLE 2

| | VRC ESTIMATOR PERFORMANCE ($\eta$) | | | |
|---|---|---|---|---|
| CPU Cores per GPU | PWR Fuel Assembly -Fuel Pin Tally | PWR Fuel Assembly -Control Rod Tally | Criticality Accident Scenario | Reflected Godiva |
| 1 | 7.3 | 9.2 | 23.0 | 2.3 |
| 4 | 6.7 | 8.3 | 23.1 | 2.2 |
| 6 | 6.4 | 7.9 | 18.7 | 2.3 |
| 8 | 6.0 | 7.2 | 15.1 | 2.2 |
| 10 | 5.2 | 6.1 | 12.5 | 2.2 |
| 12 | 4.4 | 5.4 | 10.6 | 2.2 |
| 16 | 3.7 | 4.4 | 8.3 | 2.0 |
| 20 | 3.0 | 3.6 | 6.8 | 1.6 |

For eight CPU cores per GPU, the performance increase was approximately 15 times. Simulation of a PWR fuel assembly showed performance increases of 9.2 and 7.2 for one and eight CPU cores, respectively. A simulation of the Reflected Godiva benchmark showed increases of 2.3 and 2.2 for one and eight CPU cores, respectively.

Figure 17:
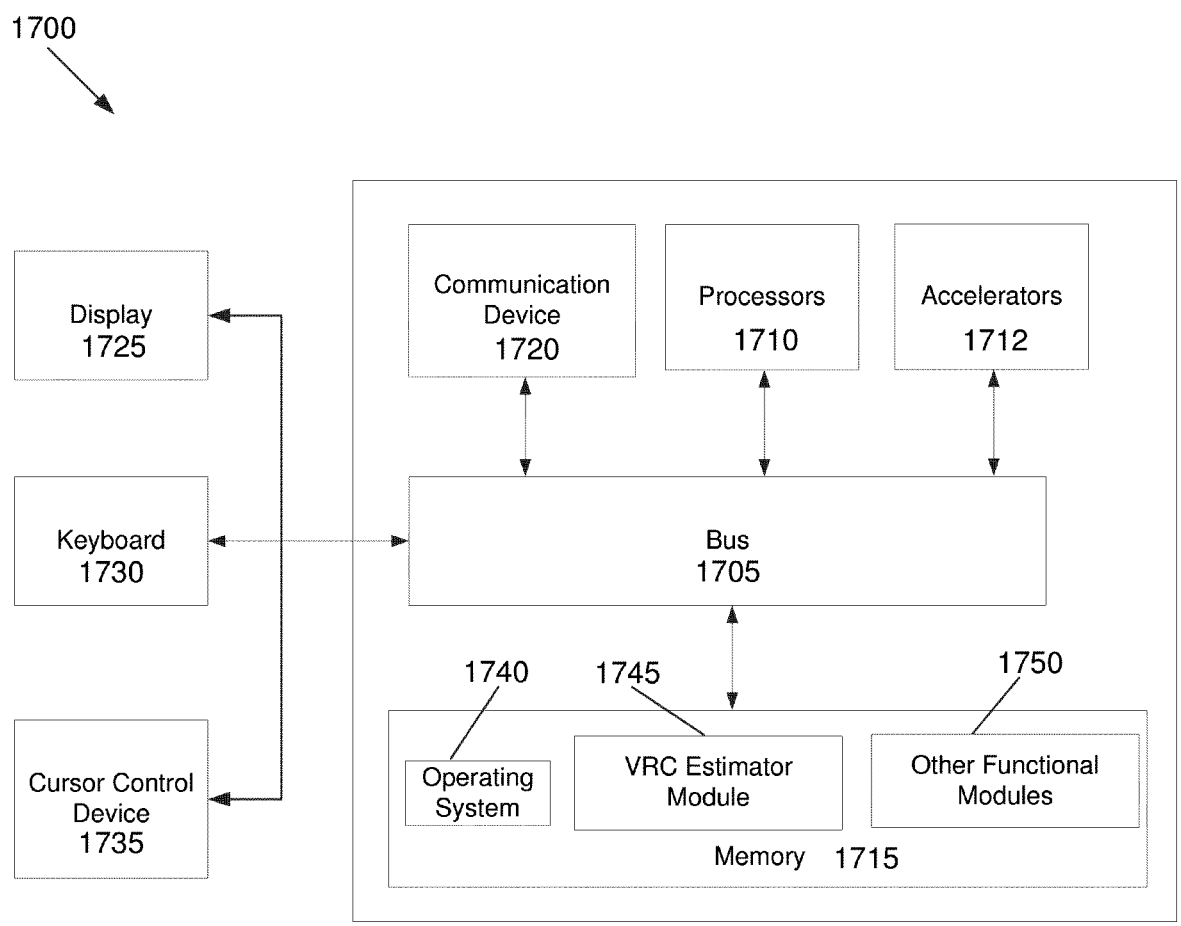
FIG. 17 is a block diagram illustrating a computing system configured to run a VRC estimator, according to an embodiment of the present invention.

FIG. 17 is a block diagram illustrating a computing system configured to run a VRC estimator, according to an embodiment of the present invention. Computing system 1700 includes a bus 1705 or other communication mechanism for communicating information, and processors 1710 and accelerators coupled to bus 1705 for processing information.

Processors 1710 and accelerators 1712 may be any of the processors and accelerators defined herein. Processors 1710 may also have multiple processing cores, and at least some of the cores may be configured to perform specific functions. Multi-parallel processing may be used in some embodiments. Computing system 1700 further includes a memory 1715 for storing information and instructions to be executed by processors 1710 and accelerators 1712. Memory 1715 can be comprised of any combination of random access memory (RAM), read only memory (ROM), flash memory, cache, static storage such as a magnetic or optical disk, or any other types of non-transitory computer-readable media or combinations thereof. Additionally, computing system 1700 includes a communication device 1720, such as a transceiver and antenna, to wirelessly provide access to a communications network.

Non-transitory computer-readable media may be any available media that can be accessed by processors 1710 and accelerators 1712, and may include both volatile and non-volatile media, removable and non-removable media, and communication media. Communication media may include computer-readable instructions, data structures, program modules or other data in a modulated data signal such as a carrier wave or other transport mechanism and includes any information delivery media.

Processors 1710 and accelerators 1712 are further coupled via bus 1705 to a display 1725, such as a Liquid Crystal Display (LCD), for displaying information to a user. A keyboard 1730 and a cursor control device 1735, such as a computer mouse, are further coupled to bus 1705 to enable a user to interface with computing system. However, in certain embodiments such as those for mobile computing implementations, a physical keyboard and mouse may not be present, and the user may interact with the device solely through display 1725 and/or a touchpad (not shown). Any type and combination of input devices may be used as a matter of design choice.

Memory 1715 stores software modules that provide functionality when executed by processors 1710 and accelerators 1712. The modules include an operating system 1740 for computing system 1700. The modules further include a VRC estimator module 1745 that is configured to perform VRC estimation by employing any of the approaches discussed herein or derivatives thereof. Computing system 1700 may include one or more additional functional modules 1750 that include additional functionality.

One skilled in the art will appreciate that a "system" could be embodied as an embedded computing system, a personal computer, a server, a console, a personal digital assistant (PDA), a cell phone, a tablet computing device, or any other suitable computing device, or combination of devices. Presenting the above-described functions as being performed by a "system" is not intended to limit the scope of the present invention in any way, but is intended to provide one example of many embodiments of the present invention. Indeed, methods, systems and apparatuses disclosed herein may be implemented in localized and distributed forms consistent with computing technology, including cloud computing systems.

It should be noted that some of the system features described in this specification have been presented as modules, in order to more particularly emphasize their implementation independence. For example, a module may be implemented as a hardware circuit comprising custom very large scale integration (VLSI) circuits or gate arrays, off-the-shelf semiconductors such as logic chips, transistors, or other discrete components. A module may also be implemented in programmable hardware devices such as field programmable gate arrays, programmable array logic, programmable logic devices, graphics processing units, or the like.

A module may also be at least partially implemented in software for execution by various types of processors. An identified unit of executable code may, for instance, comprise one or more physical or logical blocks of computer instructions that may, for instance, be organized as an object, procedure, or function. Nevertheless, the executables of an identified module need not be physically located together, but may comprise disparate instructions stored in different locations which, when joined logically together, comprise the module and achieve the stated purpose for the module. Further, modules may be stored on a computer-readable medium, which may be, for instance, a hard disk drive, flash device, RAM, tape, or any other such medium used to store data.

Indeed, a module of executable code could be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network.

Figure 18:
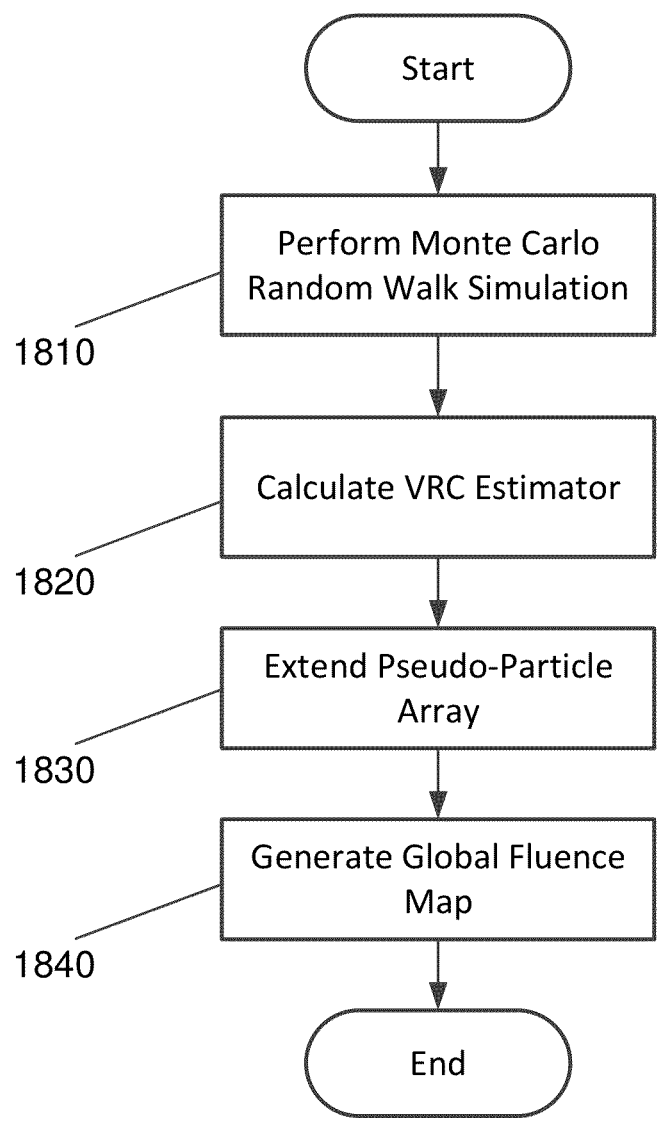
FIG. 18 is a flowchart illustrating a process for calculating global fluence for neutron and photon Monte Carlo transport, according to an embodiment of the present invention.

FIG. 18 is a flowchart 1800 illustrating a process for calculating global fluence for neutron and photon Monte Carlo transport, according to an embodiment of the present invention. The process begins with performing a Monte Carlo random walk simulation at 1810. A VRC estimator is then calculated at 1820. The VRC estimator extends a pseudo-particle ray along a direction of an emitted particle from each source and collision event through all volumes that describe a problem geometry, or until the pseudo-particle ray is no longer statistically significant within a predetermined threshold, at 1830. The VRC estimator then generates a global fluence map for neutron and photon Monte Carlo transport based on the extended pseudo-particle ray at 1840.

In some embodiments, a plurality of pseudo-particle rays are sampled per event to provide more complete angular coverage than a single pseudo-particle ray. In certain embodiments, when sampling multiple rays per source or collision event, a statistical weight of each ray is reduced by:

$$F(i,E) = \frac{W\left[1 - \exp\left(-\sum_{T,i}(E) l_i\right)\right]}{N \sum_{T,i}(E)} \times \exp\left[-\int_0^{|r'-r|} \sum_{T,i}(r + \Omega s, E) ds\right]$$

where N is a number of outgoing rays sampled per collision. In some embodiments, the memory includes a buffer and the pseudo-particle ray is generated and then stored in the buffer. In certain embodiments, when the buffer is full, the buffer is sent to at least one accelerator. In some embodiments, the calculation of the VRC estimator is performed concurrently with the Monte Carlo random walk simulation. In certain embodiments, a number of pseudo-particle rays per source or collision event is chosen such that calculations by at least one processor and at least one accelerator take equal time within several percent, or less, of a total calculation time.

Figure 19:
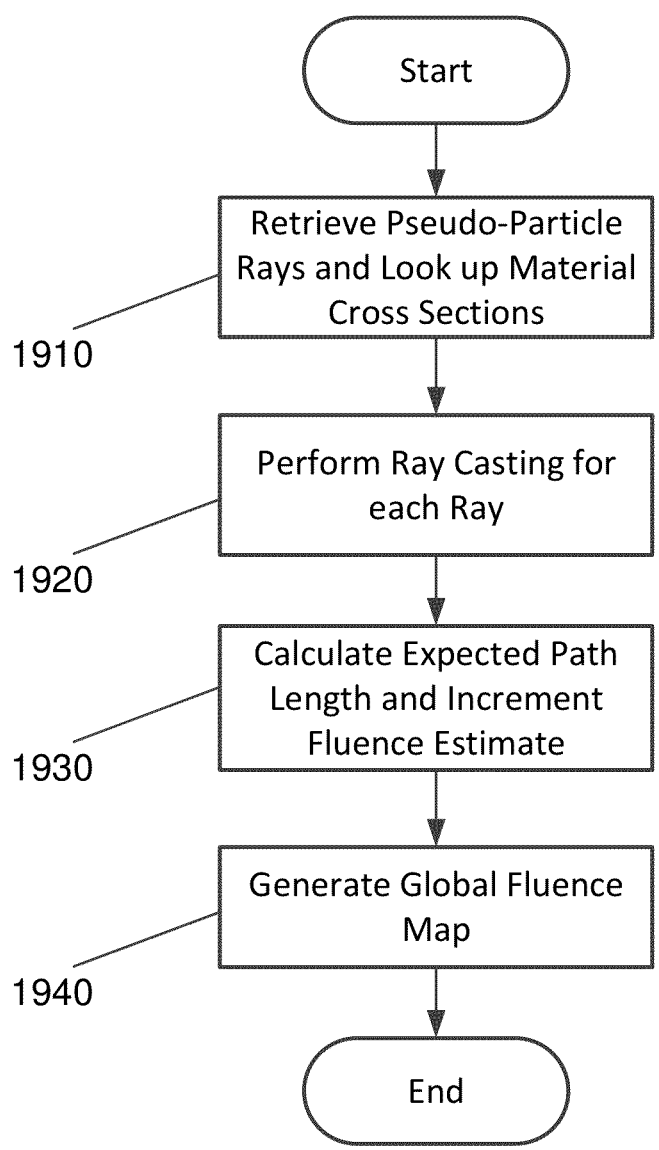
FIG. 19 is a flowchart illustrating a process for calculating global fluence for neutron and photon Monte Carlo transport, according to an embodiment of the present invention.

FIG. 19 is a flowchart 1900 illustrating a process for calculating global fluence for neutron and photon Monte Carlo transport, according to an embodiment of the present invention. The process begins with retrieving a plurality of pseudo-particle rays from a buffer and looking up all material cross-sections at an energy of the ray at 1910. Ray casting is performed for each ray at 1920. An expected path length for each cell that is crossed is calculated and a fluence estimate of each cell crossed is incremented at 1930. A global fluence map for neutron and photon Monte Carlo transport based on the incremented fluence estimate is generated at 1940.

In some embodiments, the calculating is performed concurrently on at least one accelerator with random walk simulation on at least one processor. In certain embodiments, a plurality of pseudo-particle rays are sampled per event to provide more complete angular coverage than a single pseudo-particle ray. In some embodiments, each pseudo-particle ray is generated and then stored in the buffer. In certain embodiments, when the buffer is full, the buffer is sent to at least one accelerator. In some embodiments, the calculating is performed concurrently with Monte Carlo random walk simulation. In certain embodiments, a number of pseudo-particle rays per source or collision event is chosen such that calculations by at least one processor and at least one accelerator take equal time within several percent, or less, of a total calculation time.

The process steps performed in FIGS. 4A, 4B, 5, 18, and 19 may be performed by a computer program, encoding instructions for the nonlinear adaptive processor to perform at least the processes described in FIGS. 4A, 4B, 5, 18, and 19, in accordance with embodiments of the present invention. The computer program may be embodied on a non-transitory computer-readable medium. The computer-readable medium may be, but is not limited to, a hard disk drive, a flash device, a random access memory, a tape, or any other such medium used to store data. The computer program may include encoded instructions for controlling the nonlinear adaptive processor to implement the processes described in FIGS. 4A, 4B, 5, 18, and 19, which may also be stored on the computer-readable medium.

The computer program can be implemented in hardware, software, or a hybrid implementation. The computer program can be composed of modules that are in operative communication with one another, and which are designed to pass information or instructions to display. The computer program can be configured to operate on a general purpose computer, or an ASIC.

It will be readily understood that the components of various embodiments of the present invention, as generally described and illustrated in the figures herein, may be arranged and designed in a wide variety of different configurations. Thus, the detailed description of the embodiments of the present invention, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. A computing system, comprising:
   at least one processor;
   at least one accelerator; and
   memory storing computer program code, wherein
      the computer program code, when executed, is configured to:
         cause the at least one processor to perform Monte Carlo random walk simulation on a random walk particle, and
         cause the at least one accelerator to calculate a Volumetric-Ray-Casting (VRC) estimator,
      the VRC estimator is configured to:
         extend a pseudo-particle ray along a direction of an emitted particle from each source and collision event of the random walk particle through all volumes that describe a problem geometry, wherein the pseudo-particle ray does not travel along a same path as the random walk particle and the pseudo-particle ray has a direction and an energy that are different from the random walk particle, and
         generate a global fluence map for neutron and photon Monte Carlo transport based on the extended pseudo-particle ray, and
      the computer program code, when executed, is configured to cause the at least one processor to perform at least a portion of the Monte Carlo random walk simulation while the at least one accelerator performs the VRC estimator.

2. The computing system of claim 1, wherein a plurality of pseudo-particle rays are sampled per collision event to provide more complete angular coverage than a single pseudo-particle ray.

3. The computing system of claim 2, wherein when sampling multiple rays per source or collision event, a statistical weight of each ray is reduced by:

$$F(i,E) = \frac{W\left[1-\exp\left(-\sum_{T,i}(E)l_i\right)\right]}{N\sum_{T,i}(E)} \times \exp\left[-\int_0^{|r'-r|}\sum_{T,i}(r+\Omega s, E)ds\right]$$

where F(i, E) is an expected path length, i is a tally cell, E is an energy of the particle emitted in a direction $\Omega$, W is a statistical weight of the particle at collision, $\sum_{T,i}(E)$ is a total cross-section of cell i at energy E, $l_i$ is a ray length through cell i, r is a collision point, r' is a point that the ray enters cell i, the integral expression is optical thickness, and N is a number of outgoing rays sampled per collision.

4. The computing system of claim 1, wherein the memory further comprises a buffer and the at least one processor is further configured to generate the pseudo-particle ray and store the generated ray in the buffer.

5. The computing system of claim 4, wherein when the buffer is full, the at least one processor is configured to send the buffer to the at least one accelerator.

6. The computing system of claim 1, wherein the calculation of the VRC estimator on the at least one accelerator is performed concurrently with the Monte Carlo random walk simulation of the at least one processor.

7. The computing system of claim 1, wherein a number of pseudo-particle rays per source or collision event is chosen such that calculations by the at least one processor and the at least one accelerator take equal time within three percent, or less, of a total calculation time.

8. A computer-implemented method for implementation of a Volumetric-Ray-Casting (VRC) estimator by at least one accelerator, comprising:
   retrieving a plurality of pseudo-particle rays from a buffer and looking up all material cross-sections at an energy of the ray, by the at least one accelerator;
   performing ray casting for each pseudo-particle ray, by the at least one accelerator;
   calculating, by the at least one accelerator, an expected path length for each cell that is crossed and incrementing a fluence estimate of each cell crossed; and
   generating a global fluence map for neutron and photon Monte Carlo transport based on the incremented fluence estimate, by the at least one accelerator, wherein
   the ray casting for each pseudo-particle ray comprises extending the pseudo-particle ray along a direction of an emitted particle from each source and collision event until the pseudo-particle ray has been extended through all volumes that describe a problem geometry, and
   the pseudo-particle ray does not travel along a same path as a random walk particle from a Monte Carlo random walk simulation and the pseudo-particle ray has a direction and an energy that are different from the random walk particle.

9. The computer-implemented method of claim 8, wherein the calculating by the VRC estimator is performed concurrently on the at least one accelerator with random walk simulation on at least one processor.

10. The computer-implemented method of claim 8, further comprising:
    sampling, by the at least one accelerator, a plurality of pseudo-particle rays per collision event to provide more complete angular coverage than a single pseudo-particle ray.

11. The computer-implemented method of claim 10, wherein the statistical weight of each ray is reduced by:

$$F(i,E) = \frac{W\left[1-\exp\left(-\sum_{T,i}(E)l_i\right)\right]}{N\sum_{T,i}(E)} \times \exp\left[-\int_0^{|r'-r|}\sum_{T,i}(r+\Omega s, E)ds\right]$$

where F(i, E) is an expected path length, i is a tally cell, E is an energy of the particle emitted in a direction $\Omega$, W is a statistical weight of the particle at collision, $\sum_{T,i}(E)$ is a total cross-section of cell i at energy E, $l_i$ is a ray length through cell i, r is a collision point, r' is a point that the ray enters cell i, the integral expression is optical thickness, and N is a number of outgoing rays sampled per collision.

12. The computer-implemented method of claim 8, further comprising:
    generating each pseudo-particle ray, by at least one processor; and storing the generated ray in the buffer, by the at least one processor.

13. The computer-implemented method of claim 12, wherein when the buffer is full, the method further comprises:
sending the buffer to the at least one accelerator, by the at least one processor.

14. The computer-implemented method of claim 8, wherein the calculating by the at least one accelerator is performed concurrently with Monte Carlo random walk simulation of at least one processor.

15. The computer-implemented method of claim 14, wherein a number of pseudo-particle rays per source or collision event is chosen such that calculations by the at least one processor and the at least one accelerator take equal time within three percent, or less, of a total calculation time.

16. A computing system, comprising:
at least one central processing unit (CPU);
at least one graphical processing unit (GPU); and
memory storing computer program code, wherein
the computer program code, when executed, is configured to:
cause the at least one CPU to perform Monte Carlo random walk simulation on a random walk particle, and
cause the at least one GPU to calculate a Volumetric-Ray-Casting (VRC) estimator,
the VRC estimator is configured to:
extend a pseudo-particle ray along a direction of an emitted particle from each source and collision event of the random walk particle through all volumes that describe a problem geometry, wherein the pseudo-particle ray does not travel along a same path as the random walk particle and the pseudo-particle ray has a direction and an energy that are different from the random walk particle, and
generate a global fluence map for neutron and photon Monte Carlo transport based on the extended pseudo-particle ray, and
the computer program code, when executed, is configured to cause the at least one CPU to perform at least a portion of the Monte Carlo random walk simulation while the at least one GPU performs the VRC estimator.

17. The computing system of claim 16, wherein a plurality of pseudo-particle rays are sampled per collision event to provide more complete angular coverage than a single pseudo-particle ray.

18. The computing system of claim 17, wherein when sampling multiple rays per source or collision event, a statistical weight of each ray is reduced by:

$$F(i,E) = \frac{W\left[1-\exp\left(-\sum_{T,i}(E)l_i\right)\right]}{N\sum_{T,i}(E)} \times \exp\left[-\int_0^{|r'-r|}\sum_{T,i}(r+\Omega s,E)ds\right]$$

where $F(i, E)$ is an expected path length, i is a tally cell, E is an energy of the particle emitted in a direction $\Omega$, W is a statistical weight of the particle at collision, $\Sigma_{T,i}(E)$ is a total cross-section of cell i at energy E, $l_i$ is a ray length through cell i, r is a collision point, r' is a point that the ray enters cell i, the integral expression is optical thickness, and N is a number of outgoing rays sampled per collision.

19. The computing system of claim 16, wherein
the memory further comprises a buffer, and
the at least one CPU is further configured to:
generate the pseudo-particle ray and store the generated ray in the buffer, and
when the buffer is full, send the buffer to the at least one other processor that calculates the VRC estimator.

20. The computing system of claim 16, wherein a number of pseudo-particle rays per source or collision event is chosen such that calculations by the at least one CPU and the at least one GPU take equal time within three percent, or less, of a total calculation time.

* * * * *